(12) United States Patent
Michalscheck et al.

(10) Patent No.: US 11,320,799 B2
(45) Date of Patent: May 3, 2022

(54) SYNCHRONIZING EQUIPMENT STATUS

(71) Applicant: Rockwell Automation Technologies, Inc., Mayfield Heights, OH (US)

(72) Inventors: Jimi Michalscheck, Oak Creek, WI (US); Kelly Michalscheck, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 271 days.

(21) Appl. No.: 16/709,259

(22) Filed: Dec. 10, 2019

(65) Prior Publication Data

US 2020/0117158 A1 Apr. 16, 2020

Related U.S. Application Data

(63) Continuation of application No. 15/418,448, filed on Jan. 27, 2017, now Pat. No. 10,539,943, which is a
(Continued)

(51) Int. Cl.
*G05B 19/05* (2006.01)
*G06F 16/27* (2019.01)
(Continued)

(52) U.S. Cl.
CPC ......... *G05B 19/05* (2013.01); *G06F 16/2443* (2019.01); *G06F 16/27* (2019.01);
(Continued)

(58) Field of Classification Search
USPC ...... 434/1–99, 100–199, 200–299, 300–399, 434/400–433
See application file for complete search history.

(56) References Cited

U.S. PATENT DOCUMENTS 5,146,217 A 9/1992 Holmes et al.
6,009,420 A 12/1999 Fagg, III et al.
(Continued)

FOREIGN PATENT DOCUMENTS

DE 10239831 A1 3/2004

OTHER PUBLICATIONS

European Patent Office, "Communication Pursuant to Article 94(3) EPC", EPO, dated Feb. 14, 2020, pp. 1-7.
(Continued)

*Primary Examiner* — Marcus T Riley
(74) *Attorney, Agent, or Firm* — Kunzler Bean & Adamson

(57) ABSTRACT

For equipment tutorial review audit, a processor synchronizes a plurality of equipment tutorials to a mobile device. Each equipment tutorial corresponds to an equipment instance of a plurality of equipment instances of specific equipment and each equipment instance corresponds to an equipment reference code. The processor receives a first equipment reference code for a first equipment instance at the mobile device. The processor retrieves a first equipment tutorial of the plurality of equipment tutorials that is indexed to the first equipment reference code at the mobile device. The processor displays the first equipment tutorial on the mobile device. In addition, the processor records a review of the first equipment tutorial by an operator to an audit report.

20 Claims, 20 Drawing Sheets

Related U.S. Application Data continuation of application No. 15/189,677, filed on Jun. 22, 2016, now Pat. No. 9,778,643, which is a continuation of application No. 14/633,719, filed on Feb. 27, 2015, now Pat. No. 9,400,495, which is a continuation-in-part of application No. 14/298,657, filed on Jun. 6, 2014, now Pat. No. 9,201,940, which is a continuation-in-part of application No. 14/271,527, filed on May 7, 2014, now Pat. No. 9,247,009, and a continuation-in-part of application No. 13/653,187, filed on Oct. 16, 2012, now Pat. No. 8,751,504.

(60) Provisional application No. 61/945,488, filed on Feb. 27, 2014.

(51) Int. Cl.

| | | |
|---|---|---|
| *G06F 16/242* | (2019.01) | |
| *G06Q 10/06* | (2012.01) | |
| *G06Q 30/00* | (2012.01) | |
| *G06F 30/20* | (2020.01) | |
| *H04W 64/00* | (2009.01) | |
| *G09B 5/06* | (2006.01) | |
| *G09B 19/00* | (2006.01) | |
| *G06Q 10/00* | (2012.01) | |
| *G05B 15/02* | (2006.01) | |

(52) U.S. Cl.
CPC ......... *G06F 30/20* (2020.01); *G06Q 10/0631* (2013.01); *G06Q 30/018* (2013.01); *G09B 5/065* (2013.01); *G09B 19/00* (2013.01); *H04W 64/00* (2013.01); *G05B 15/02* (2013.01); *G05B 2219/13174* (2013.01); *G06Q 10/20* (2013.01)

(56) References Cited

U.S. PATENT DOCUMENTS

| | | | |
|---|---|---|---|
| 6,026,166 | A | 2/2000 | LeBourgeois |
| 6,061,018 | A | 5/2000 | Sheynblat |
| 6,091,738 | A | 7/2000 | Tsujikado et al. |
| 6,345,207 | B1 | 2/2002 | Nitta et al. |
| 6,370,364 | B1 | 4/2002 | Liimatainen |
| 6,453,237 | B1 | 9/2002 | Fuchs et al. |
| 6,467,078 | B1 | 10/2002 | Matsuba et al. |
| 6,556,950 | B1 | 4/2003 | Schwenke et al. |
| 6,604,014 | B1 | 8/2003 | Barnett et al. |
| 6,795,771 | B2 | 9/2004 | Fuchs et al. |
| 6,868,057 | B1 | 3/2005 | Sha |
| 6,993,456 | B2 | 1/2006 | Brooks et al. |
| 7,363,193 | B2 | 4/2008 | Jacobs et al. |
| 7,494,055 | B2 | 2/2009 | Fernandes et al. |
| 8,312,540 | B1 | 11/2012 | Kahn et al. |
| 8,331,955 | B2 | 12/2012 | Bull et al. |
| 8,447,144 | B2 * | 5/2013 | King ................... G06F 16/332 382/313 |
| 8,533,075 | B1 | 9/2013 | Sayers et al. |
| 8,550,365 | B1 | 10/2013 | Minvielle |
| 8,612,590 | B1 | 12/2013 | Chaddha et al. |
| 8,619,147 | B2 * | 12/2013 | King ................... G06Q 30/0643 348/210.99 |
| 8,633,799 | B1 | 1/2014 | Aronson et al. |
| 8,645,092 | B2 * | 2/2014 | Manning .......... G05B 19/41875 702/84 |
| 8,971,216 | B2 * | 3/2015 | Beck ................ H04L 67/22 370/260 |
| 9,400,495 | B2 * | 7/2016 | Michalscheck ....... H04W 64/00 |
| 9,778,643 | B2 * | 10/2017 | Michalscheck ........ G05B 19/05 |
| 10,347,145 | B1 | 7/2019 | Braunberger et al. |
| 10,539,943 | B2 * | 1/2020 | Michalscheck ....... G06Q 30/018 |
| 10,641,861 | B2 * | 5/2020 | Dupray ................ G01S 5/0278 |
| 10,684,350 | B2 * | 6/2020 | Dupray ................ G01S 5/0263 |
| 2002/0026339 | A1 | 2/2002 | Frankland et al. |
| 2002/0103668 | A1 | 8/2002 | Ecklund et al. |
| 2002/0132214 | A1 | 9/2002 | Mattson et al. |
| 2002/0152179 | A1 | 10/2002 | Racov |
| 2003/0018398 | A1 | 1/2003 | Juntunen et al. |
| 2003/0120359 | A1 | 6/2003 | O'Leary et al. |
| 2004/0186697 | A1 | 9/2004 | Schreier et al. |
| 2004/0207756 | A1 | 10/2004 | Fujii et al. |
| 2004/0224294 | A1 | 11/2004 | Heininger et al. |
| 2004/0232219 | A1 | 11/2004 | Fowler |
| 2005/0061890 | A1 | 3/2005 | Hinckley |
| 2005/0065813 | A1 * | 3/2005 | Mishelevich .......... G16H 50/30 705/2 |
| 2005/0071034 | A1 | 3/2005 | Mitrovic |
| 2005/0084831 | A1 | 4/2005 | Ison et al. |
| 2005/0100201 | A1 | 5/2005 | Mayer et al. |
| 2005/0159982 | A1 | 7/2005 | Showalter et al. |
| 2006/0011721 | A1 | 1/2006 | Olsen, III et al. |
| 2006/0014126 | A1 * | 1/2006 | Esposito ................ G09B 23/28 434/262 |
| 2006/0047538 | A1 | 3/2006 | Condurso et al. |
| 2006/0087402 | A1 * | 4/2006 | Manning .......... G05B 19/41875 340/3.1 |
| 2006/0117303 | A1 | 6/2006 | Gizinski |
| 2006/0218680 | A1 | 9/2006 | Bailey |
| 2007/0011022 | A1 | 1/2007 | Wright, Jr. et al. |
| 2007/0055559 | A1 | 3/2007 | Clawson |
| 2007/0087756 | A1 * | 4/2007 | Hoffberg ................ G06Q 20/40 455/450 |
| 2007/0113081 | A1 | 5/2007 | Camp |
| 2007/0136814 | A1 | 6/2007 | Lee et al. |
| 2007/0142939 | A1 | 6/2007 | Duffy et al. |
| 2007/0176745 | A1 | 8/2007 | Gibson et al. |
| 2007/0260607 | A1 | 11/2007 | Hajdukiewicz et al. |
| 2007/0269782 | A1 | 11/2007 | Puente |
| 2008/0027691 | A1 | 1/2008 | Kobayashi et al. |
| 2008/0027704 | A1 | 1/2008 | Kephart et al. |
| 2008/0052527 | A1 | 2/2008 | Siedlarz |
| 2008/0168092 | A1 | 7/2008 | Boggs et al. |
| 2008/0235055 | A1 | 9/2008 | Mattingly et al. |
| 2008/0262816 | A1 | 10/2008 | Lontka |
| 2008/0281472 | A1 | 11/2008 | Podgorny et al. |
| 2009/0089030 | A1 | 4/2009 | Sturrock et al. |
| 2009/0109055 | A1 | 4/2009 | Burch et al. |
| 2009/0112524 | A1 | 4/2009 | Schiefer |
| 2009/0125128 | A1 | 5/2009 | Eldridge et al. |
| 2009/0144095 | A1 | 6/2009 | Shahi et al. |
| 2009/0192857 | A1 | 7/2009 | Morse et al. |
| 2009/0204434 | A1 | 8/2009 | Breazeale, Jr. |
| 2009/0234690 | A1 | 9/2009 | Nikipelo |
| 2009/0299993 | A1 | 12/2009 | Novack |
| 2009/0319660 | A1 | 12/2009 | Cavalaris et al. |
| 2010/0022233 | A1 | 1/2010 | Jung et al. |
| 2010/0124196 | A1 | 5/2010 | Bonar et al. |
| 2010/0131928 | A1 | 5/2010 | Parthasarathy et al. |
| 2010/0138566 | A1 | 6/2010 | Knight |
| 2010/0190526 | A1 | 7/2010 | Marks |
| 2010/0197383 | A1 | 8/2010 | Rader et al. |
| 2010/0217623 | A1 | 8/2010 | Schoenberg et al. |
| 2010/0227607 | A1 | 9/2010 | Lorion et al. |
| 2010/0241465 | A1 | 9/2010 | Amigo et al. |
| 2011/0126207 | A1 | 5/2011 | Wipfel et al. |
| 2011/0153358 | A1 | 6/2011 | Campo et al. |
| 2011/0160964 | A1 | 6/2011 | Obradovich |
| 2011/0184776 | A1 * | 7/2011 | Spradling ............... G06Q 10/10 705/7.28 |
| 2011/0208657 | A1 | 8/2011 | Rao |
| 2011/0213722 | A1 | 9/2011 | Carson et al. |
| 2011/0224953 | A1 | 9/2011 | Webster et al. |
| 2011/0258160 | A1 | 10/2011 | Lee et al. |
| 2011/0276886 | A1 | 11/2011 | Hall et al. |
| 2011/0285160 | A1 | 11/2011 | Bartnick |
| 2011/0320799 | A1 | 12/2011 | Lam |
| 2012/0014488 | A1 | 1/2012 | Liu et al. |
| 2012/0076352 | A1 | 3/2012 | Quinn et al. |
| 2012/0102543 | A1 | 4/2012 | Kohli et al. |
| 2012/0116203 | A1 | 5/2012 | Vancraen et al. |
| 2012/0165037 | A1 | 6/2012 | Bull et al. |
| 2012/0166203 | A1 * | 6/2012 | Fuchs .................. G16H 40/20 704/275 |

(56) References Cited

U.S. PATENT DOCUMENTS

| | | |
|---|---|---|
| 2012/0187185 A1 | 7/2012 | Sayan |
| 2012/0197619 A1 | 8/2012 | Namer Yelin et al. |
| 2012/0259655 A1 | 10/2012 | Madreperla |
| 2012/0311454 A1 | 12/2012 | Danis |
| 2012/0329553 A1 | 12/2012 | Gagner et al. |
| 2013/0013928 A1 | 1/2013 | Thom et al. |
| 2013/0028410 A1 | 1/2013 | Parrish |
| 2013/0038633 A1 | 2/2013 | Maggiore |
| 2013/0073228 A1 | 3/2013 | Fulghum et al. |
| 2013/0111555 A1 | 5/2013 | Leneel |
| 2013/0187756 A1 | 7/2013 | Fisher |
| 2013/0191106 A1 | 7/2013 | Kephart et al. |
| 2013/0197899 A1 | 8/2013 | Roulland et al. |
| 2013/0214903 A1 | 8/2013 | Kalous et al. |
| 2013/0334300 A1 | 12/2013 | Evans |
| 2014/0082257 A1 | 3/2014 | Scouller et al. |
| 2014/0269417 A1 | 9/2014 | Yu et al. |
| 2015/0168937 A1* | 6/2015 | Michalscheck .... G06Q 10/0631 700/83 |
| 2016/0306334 A1* | 10/2016 | Michalscheck ........ G09B 5/065 |
| 2017/0148335 A1* | 5/2017 | Michalscheck ..... G06F 16/2443 |
| 2020/0117158 A1* | 4/2020 | Michalscheck ..... G06F 16/2443 |

OTHER PUBLICATIONS

Herve Debar and Jouni Viinikka, "Intrusion Detection: Introduction to Intrusion Detection and Security Information Management", Foundations of Security Analysis and Design III—Lecture Notes in Computer Science vol. 3655, 2005, pp. 207-236.

Marius Popa, "Audit Process During Projects for Development of New Mobile IT Applications", Informatic Economica, vol. 14, No. 3, 2010, pp. 34-46.

Lei Li et al., "A fast development framework for condition-based maintenance systems", Mechanical and Electronics Engineering (ICMEE), 2010 2nd International Conference on (vol. 2), Date of Conference: Aug. 1-3, 2010 Kyoto, pp. V2-70-V2-74.

Khiam Wei Ow et al., "MES Validation using FAB-wide Equipment Simulation", Advanced Semiconductor Manufacturing Conference, 2006, ASMC 2006, The 17th Annual SEMI/IEEE, Date of Conference May 22-247, 2006 Boston MA, pp. 316-321.

* cited by examiner

165

Audit Report
230a

Audit Report
230b

Audit Report
230c

| Auditor Data 232 | Attestation 240 |
|---|---|
| Audit Time 234 | Audit Status 242 |
| Audit Result 236 | Equipment Reference Code 205 |
| User ID 238 | Procedure ID 225 |
| Audit Frequency 237 | Audit Issues 243 |

FIG. 2G

SYNCHRONIZING EQUIPMENT STATUS

CROSS-REFERENCE TO RELATED APPLICATIONS

This is a continuation of and claims priority to U.S. patent application Ser. No. 15/418,448 entitled "EQUIPMENT TUTORIAL REVIEW AUDIT" and filed on Jan. 27, 2017 for Jimi Michalscheck and Kelly Michalscheck, which is incorporated herein in its entirety by reference, and which claims priority to U.S. patent application Ser. No. 15/189,677 entitled "MACHINE PROCEDURE SIMULATION" and filed on Jun. 22, 2016 for Jimi Michalscheck and Kelly Michalscheck, which is incorporated herein by reference. U.S. patent application Ser. No. 15/189,677 is a continuation of and claims priority to U.S. Pat. No. 9,400,495 entitled "INDUSTRIAL AUTOMATION EQUIPMENT AND MACHINE PROCEDURE SIMULATION" and filed on Feb. 27, 2015 for Jimi Michalscheck and Kelly Michalscheck, which is incorporated herein in its entirety by reference. U.S. Pat. No. 9,400,495 is a continuation-in-part application of and claims priority to U.S. Provisional Patent Application 61/945,488 entitled "SHOWING PROCEDURE STEP CONSEQUENCES" and filed on Feb. 27, 2014 for Jimi Michalscheck and Kelly Michalscheck, which is incorporated herein in its entirety by reference, and further claims priority to U.S. Pat. No. 9,201,940 entitled "PROVIDING PROCEDURES" and filed on Jun. 6, 2014 for Jimi Michalscheck, which is incorporated herein by reference, and which claims priority to U.S. Pat. No. 8,751,504 entitled "PROVIDING PROCEDURES" and filed on Oct. 16, 2012 for Jimi Michalscheck, which is incorporated herein in its entirety by reference, and is a continuation-in-part of and claims priority to U.S. Pat. No. 9,171,305 entitled "PROVIDING EQUIPMENT PERMITS AND CONFINED SPACE ACCESS PROCEDURES" and filed on May 6, 2014 for Jimi Michalscheck, which is incorporated herein in its entirety by reference.

FIELD

The subject matter disclosed herein relates to an equipment tutorial review audit.

BACKGROUND

Equipment, particularly industrial equipment, can be dangerous to maintain and operate. Operational safety is enhanced when appropriate procedures are effectively communicated and learned.

BRIEF SUMMARY

A method for equipment tutorial review audit is disclosed. A processor synchronizes a plurality of equipment tutorials to a mobile device. Each equipment tutorial corresponds to an equipment instance of a plurality of equipment instances of specific equipment and each equipment instance corresponds to an equipment reference code. The processor receives a first equipment reference code for a first equipment instance at the mobile device. The processor retrieves a first equipment tutorial of the plurality of equipment tutorials that is indexed to the first equipment reference code at the mobile device. The processor displays the first equipment tutorial on the mobile device. In addition, the processor records a review of the first equipment tutorial by an operator to an audit report. An apparatus and computer program product also performs the functions of the method.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 2F is a schematic block diagram illustrating one embodiment of an audit database 165;

FIG. 2G is a schematic block diagram illustrating one embodiment of an audit report;

DETAILED DESCRIPTION

Figure 1:
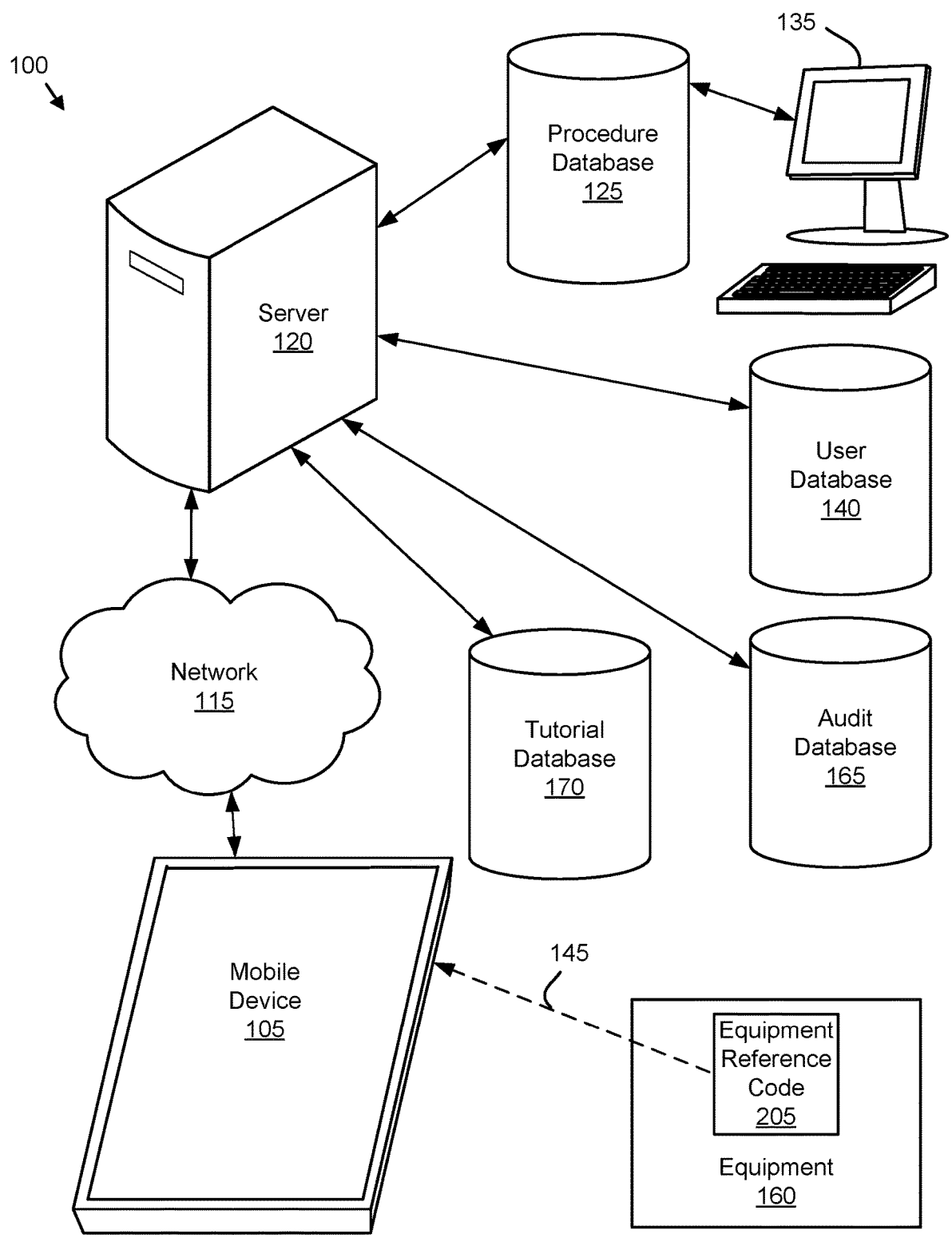
FIG. 1 is a schematic block diagram illustrating one embodiment of a system for providing procedures.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible and/or non-transitory computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the operator's computer, partly on the operator's computer, as a stand-alone software package, partly on the operator's computer and partly on a remote computer or entirely on the remote computer or server. In the latter scenario, the remote computer may be connected to the operator's computer through any type of network, including a local area network (LAN) or a wide area network (WAN), or the connection may be made to an external computer (for example, through the Internet using an Internet Service Provider).

The computer program product may be shared, simultaneously serving multiple customers in a flexible, automated fashion. The computer program product may be standardized, requiring little customization and scalable, providing capacity on demand in a pay-as-you-go model.

The computer program product may be stored on a shared file system accessible from one or more servers. The computer program product may be executed via transactions that contain data and server processing requests that use Central Processor Unit (CPU) units on the accessed server. CPU units may be units of time such as minutes, seconds, hours on the central processor of the server. Additionally the accessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same computer program product via shared execution, transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the computer program product. The summed measurements of use units are periodically multiplied by unit costs and the resulting total computer program product service costs are alternatively sent to the customer and or indicated on a web site accessed by the customer which then remits payment to the service provider.

In one embodiment, the service provider requests payment directly from a customer account at a banking or financial institution. In another embodiment, if the service provider is also a customer of the customer that uses the computer program product, the payment owed to the service provider is reconciled to the payment owed by the service provider to minimize the transfer of payments.

The computer program product may be integrated into a client, server and network environment by providing for the computer program product to coexist with applications, operating systems and network operating systems software and then installing the computer program product on the clients and servers in the environment where the computer program product will function.

In one embodiment software is identified on the clients and servers including the network operating system where the computer program product will be deployed that are required by the computer program product or that work in conjunction with the computer program product. This includes the network operating system that is software that enhances a basic operating system by adding networking features.

In one embodiment, software applications and version numbers are identified and compared to the list of software applications and version numbers that have been tested to work with the computer program product. Those software applications that are missing or that do not match the correct version will be upgraded with the correct version numbers. Program instructions that pass parameters from the computer program product to the software applications will be checked to ensure the parameter lists match the parameter lists required by the computer program product. Conversely parameters passed by the software applications to the computer program product will be checked to ensure the parameters match the parameters required by the computer program product. The client and server operating systems including the network operating systems will be identified and compared to the list of operating systems, version numbers and network software that have been tested to work with the computer program product. Those operating systems, version numbers and network software that do not match the list of tested operating systems and version numbers will be upgraded on the clients and servers to the required level.

In response to determining that the software where the computer program product is to be deployed, is at the correct version level that has been tested to work with the computer program product, the integration is completed by installing the computer program product on the clients and servers.

Furthermore, the described features, structures, or characteristics of the embodiments may be combined in any suitable manner. In the following description, numerous specific details are provided, such as examples of programming, software modules, operator selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

Embodiments Elements

FIG. 1 is a schematic block diagram illustrating one embodiment of a system 100 for providing procedures. The system 100 provides a procedure for equipment 160. The system 100 includes a server 120, a procedure database 125, a operator database 140, an audit database 165, a tutorial database 170, a workstation 135, a network 115, a mobile device 105, a plurality of equipment 160, and an equipment reference code 205 for each equipment instance 160. For simplicity, a single equipment instance 160 and a single equipment reference code 205 are shown.

The equipment 160 may be electrical equipment, hydraulic equipment, compressed air equipment, steam equipment, mechanical tools, protective equipment, refrigeration equipment, power lines, hydraulic lines, steam lines, or combinations thereof. Alternatively, the equipment 160 may be containers of hazardous substances, containers of biological substances, containers of chemical substances, or combinations thereof.

An equipment procedure is often specified for safely operating and/or maintaining the equipment 160. The equipment procedure may specify in more detail the process steps, tools, safety equipment, and the like that must be complied with when operating and maintaining the equipment 160. The equipment 160 may also require one or more equipment permits to comply with regulations for the equipment 160.

Unfortunately, in the past the equipment procedures and/or equipment permits have not always been available when there is a need to operate and/or maintain the equipment 160. For example, when equipment procedures are centrally stored, a operator may need to anticipate and acquire the required equipment procedures before operating and/or maintaining the equipment 160.

In addition, the operator that had earlier acquired the equipment procedure may be unaware that the equipment procedure had been updated. As a result, in the past, operators have often lacked the latest equipment procedures or did not have the latest equipment permits.

The embodiments described herein provide the most current equipment procedures to the operator as will be described hereafter. In addition, the embodiments provide current equipment permits. As a result, even when working remotely, the operator is assured of having the most current equipment procedures and/or equipment permits, allowing the operator to safely operate or maintain the equipment 160.

In order to enhance safety and comply with safety regulations, the availability and proper use of an equipment procedure for the equipment 160 may be periodically audited. Such an audit may be difficult to track, manage, and report. The embodiments also record if the operator follows an equipment procedure and/or complies with an equipment permit to an audit report and synchronizes the audit report to the audit database 165 as will be described hereafter.

An operator may be uncertain as to how to apply equipment procedures. The embodiments also provide equipment tutorials associated with the equipment 160. The operator may access the equipment tutorials to learn how to properly carry out steps of the equipment procedures as will be described hereafter.

The operator may be unaware of the consequences of violating the equipment procedures or performing the equipment procedures incorrectly. In addition, the operator may be unaware of the consequences of disregarding requirements of the equipment permits. The embodiments may receive a selection of a procedure step from the operator in response to a procedure description. The embodiments may further display a step consequence depicting an operator simulation interacting with the machine simulation in response to the procedure step as will be described hereafter. As a result, the operator is given a strong visual reinforcement of the learning of the tutorial, making the lessons of the tutorial more memorable and effective.

The equipment reference code 205 is associated with the equipment 160. The equipment reference code 205 may be affixed to the equipment 160. Alternatively, the equipment reference code may be mounted near the equipment 160. In one embodiment, the equipment reference code 205 is printed on an adhesive label that is affixed to the equipment 160. The equipment reference code 205 may be encoded as a Quick Reference (QR) code. In addition, the equipment reference code 205 may also be displayed in a human readable form.

In an alternate embodiment, the equipment reference code 205 is encoded as a barcode. The equipment reference code 205 may also be encoded as an identification code broadcast via a Radio Frequency Identifier (RFID).

The equipment reference code 205 refers to equipment procedures stored in the procedure database 125. In addition, the equipment reference code 205 may refer to equipment permits for the equipment 160. In one embodiment, the equipment reference code 205 is used as an index to the equipment procedures and/or equipment permits. The equipment procedures and equipment permits may be created, edited, updated, and/or deleted from the workstation 135.

The server 120 may communicate the equipment procedures and/or equipment permits through the network 115 to the mobile device 105. The network 115 may be the Internet, a mobile telephone network, a wide area network, a local area network, a wireless network, or combinations thereof. The server 120 may be a remote server 120.

The server 120 may synchronize all the equipment procedures and/or equipment permits in the procedure database 125 to the mobile device 105 so that the mobile device 105 stores a copy of all the equipment procedures and/or equipment permits in the procedure database 125. Thus all the equipment procedures and/or equipment permits may be available on the mobile device 105. In addition, the server 120 may synchronize equipment tutorials from the tutorial database 170 to the mobile device 105.

The mobile device 105 may further display the step simulation showing the consequences of a selected procedure step. As a result, the lessons of the equipment tutorials are made more meaningful and memorable.

The equipment procedures may be grouped by site. In one embodiment, the server 120 maintains a site list of all the equipment 160 at a specified site. The site list may include an equipment reference code 205 for each equipment instance 160 at the specified site. Alternatively, the site list may include a procedure identifier for each equipment instance 160 at the specified site. The server 120 may synchronize only the equipment procedures and/or equipment permits of a site list to the mobile device 105 in response to receiving an equipment reference code 205 and/or procedure identifier for one of the equipment instances 160 on the site list. In one embodiment, the equipment procedures and/or equipment permits are organized as a database, a data structure, or combinations thereof on the mobile device 105.

The mobile device 205 may be a tablet computer, a mobile phone, a notebook computer, a personal digital assistant, or the like. The mobile device 105 may receive 145 the equipment reference code 205. In one embodiment, the mobile device 105 optically scans a QR code encoding the equipment reference code 205. Alternatively, the mobile device 105 may optically scan a barcode encoding the equipment reference code 205. In a certain embodiment, the mobile device 105 wirelessly queries an RFID equipment reference code 205 and receives the equipment reference code 205 encoded in a wireless response from the RFID.

The mobile device 105 may use the equipment reference code 205 as an index to retrieve the equipment procedures and/or equipment permits associated with the equipment reference code 205 from the mobile device 105. The mobile device 105 may display the equipment permits and any information associated with the equipment permits. The mobile device 105 may also display the equipment procedure, allowing the operator to perform the equipment procedure on the equipment 160.

If the equipment procedures and/or equipment permits associated with the equipment reference code 205 are not stored on the mobile device 105, the mobile device 105 may use the equipment reference code 205 to request equipment procedures and/or equipment permits from the server 120 through the network 115. The server 120 may synchronize the equipment procedures and/or equipment permits from the procedure database 125 through the network 115 to the mobile device 105 so that the equipment procedures and/or equipment permits may be displayed by the mobile device 105.

By synchronizing the equipment procedures and/or equipment permits to the mobile device 105, a operator may reference the correct equipment permit for the equipment 160 even if a physical copy of the equipment permit is not available locally. In addition, the operator may access the correct equipment procedure for the equipment 160 on the mobile device 105 even if a paper document with the equipment procedure has been removed from the equipment 160 or if an incorrect equipment procedure is placed with the equipment 160.

Figure 2A:
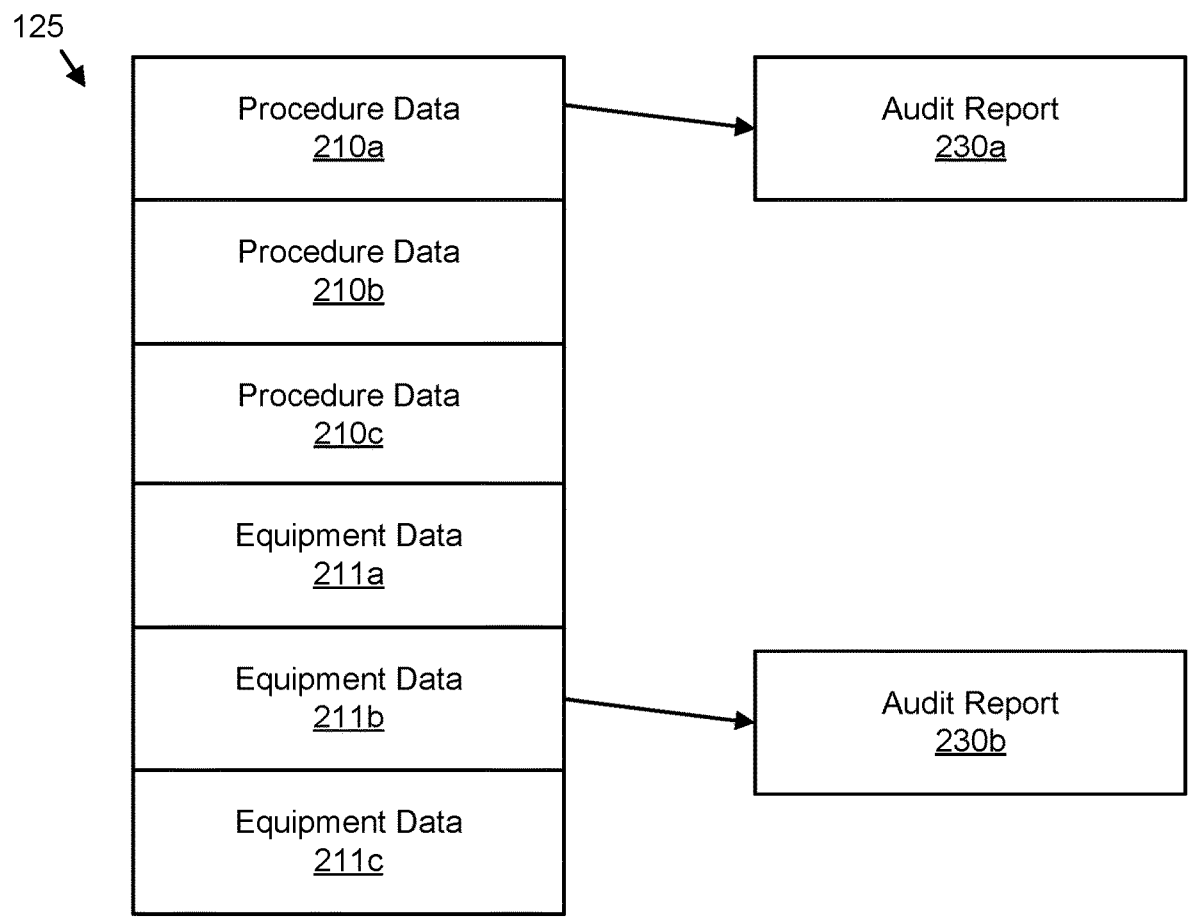
FIG. 2A is a schematic block diagram illustrating one embodiment of a procedure database.

FIG. 2A is a schematic block diagram illustrating one embodiment of a procedure database 125. The procedure database 125 is the procedure database 125 of FIG. 1. The procedure database 125 includes procedure data 210 and equipment data 211 as will be described hereafter. The procedure database 125 may include a plurality of tables, with a plurality of entries in each table. In addition, the procedure data 210 and equipment data 211 may be associated with one or more audit reports 230. In one embodiment, the audit reports 230 are stored in the audit database 165 as will be described hereafter.

Figure 2B:
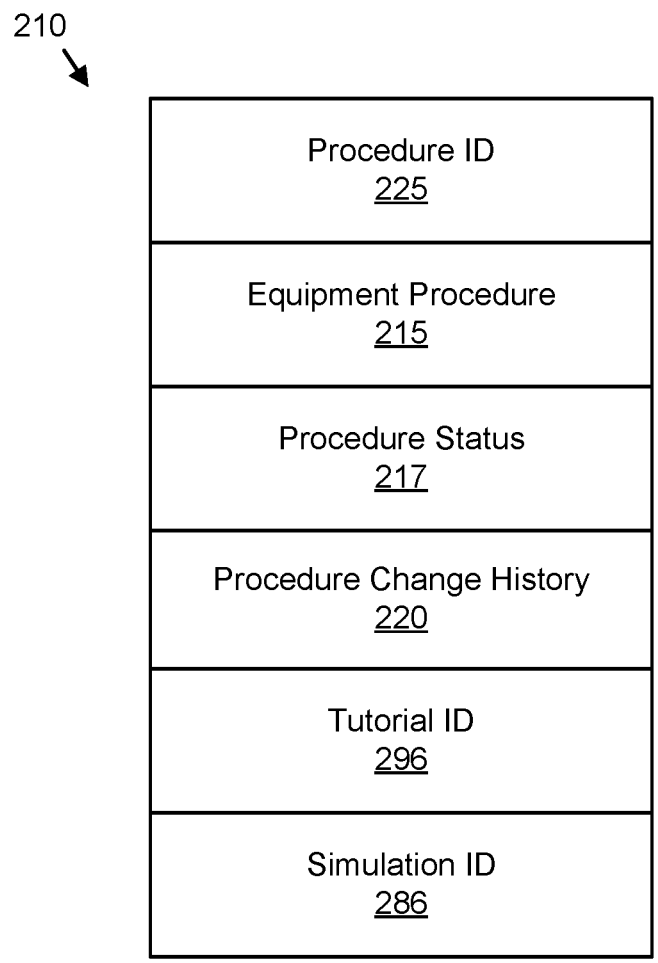
FIG. 2B is a schematic block diagram illustrating one embodiment of procedure data.

FIG. 2B is a schematic block diagram illustrating one embodiment of procedure data 210. The procedure data 210 is the procedure data 210 of FIG. 2A. The procedure data 210 may include a procedure identifier 225, an equipment procedure 215, a procedure status 217, a procedure change history 220, a tutorial identifier 296, and a simulation identifier.

The procedure identifier 225 may uniquely identify the equipment procedure 215. The procedure identifier 225 may be an index to the procedure database 125. In addition, the procedure identifier 225 may include a title.

The equipment procedure 215 may include instructions in text, hypertext, audio, video, images, and combinations thereof. The equipment procedure 215 may be displayed and/or transmitted to allow the operator to perform one or more operations on the equipment 160. For example, the equipment procedure 215 may specify safety equipment for use with equipment 160, may specify safety checks for operating the equipment 160, may specify operations for maintaining the equipment 160, and may specify actions to be performed while operating the equipment 160. In a certain embodiment, the equipment procedure 215 includes a contact link that connects the operator to an expert or service personnel.

The equipment procedure 215 may be an arc flash procedure. The arc flash procedure may specify personal protective equipment, voltage and amperage magnitudes, energy source locations, energy dissipation procedures, and the like for the equipment 160. In addition, the arc flash procedure may specify audit requirements including audit results and audit frequencies.

In one embodiment, the equipment procedure 215 is a machine guarding procedure. The machine guarding procedure may specify guards for the equipment 160. In addition, the machine guarding procedure may specify the placement of the guards relative to the equipment 160. In one embodiment, the machine guarding procedure may specify how to test the guards. In addition, the machine guarding procedure may specify how to maintain the guards. In one embodiment, the machine guarding procedure may specify audit requirements including audit results and audit frequencies.

The equipment procedure 215 may also be a maintenance procedure. In one embodiment, the maintenance procedure is a preventive maintenance procedure. The maintenance procedure may specify how to maintain the equipment 160. In one embodiment, the maintenance procedure may only be accessed after accessing and/or completing a lockout procedure. The maintenance procedure may also specify audit requirements including audit results and audit frequencies.

The equipment procedure 215 may further be an operating procedure. The operating procedure may specify how to operate the equipment 160. The operating procedure may specify personal protective equipment for operating the equipment 160, the placement of the equipment 160, safety devices for the equipment 160, testing of the equipment 160, process steps for using equipment 160, and the like. In one embodiment, the operating procedure specifies audit requirements including audit results and audit frequencies.

In one embodiment, the equipment procedure 215 is an equipment hazard procedure. The equipment hazard procedure may show known hazards for the equipment 160. In one embodiment, the equipment hazard procedure may be links to related equipment procedures 215. In one embodiment, the equipment hazard procedure may list the hazards by frequency. Alternatively, the equipment hazard procedure may list the hazards by operation type. In one embodiment, the equipment hazard procedure specifies audit requirements including audit results and audit frequencies.

The equipment status 217 may indicate that an audit for the equipment 160 and/or the equipment procedure 215 is passed, failed, and/or that the audit is complete. The procedure change history 220 may record changes to the equipment procedure 215. In one embodiment, changes are recorded to the procedure change history 220 automatically when the changes are made. For example, the operator may be prompted to enter a description of the change after entering the change. Alternatively, the changes may be recorded from comparisons of different versions of the equipment procedure 215.

The tutorial identifier 296 identifies one or more equipment tutorials associated with the equipment procedure 215. The simulation identifier 286 may identify one or more simulations associated with the equipment procedure 215.

Figure 2C:
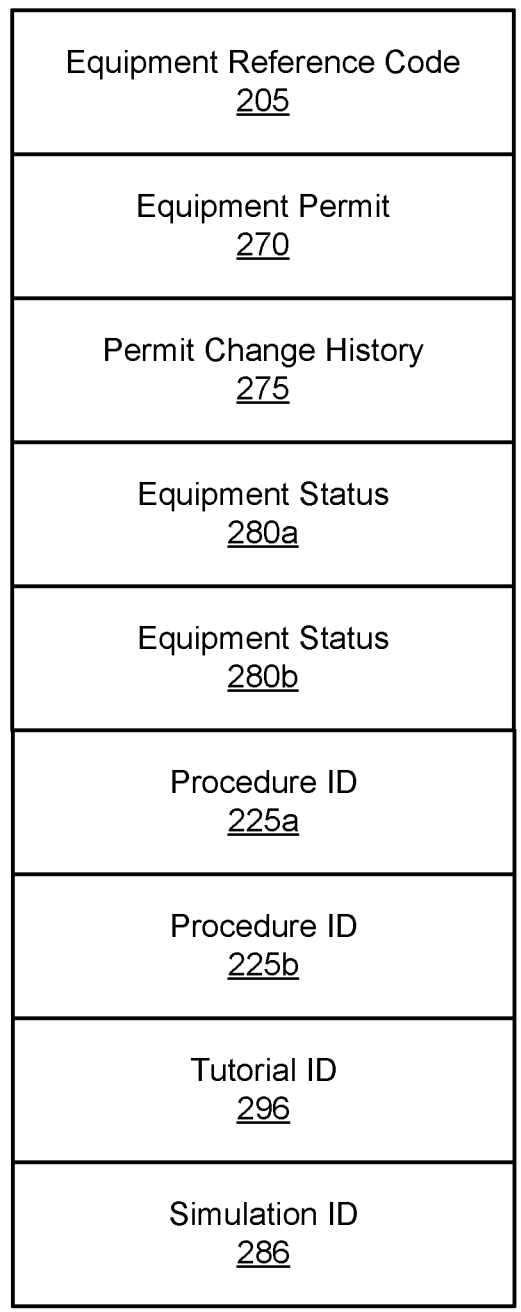
FIG. 2C is a schematic block diagram illustrating one embodiment of equipment data.

FIG. 2C is a schematic block diagram illustrating one embodiment of the equipment data 211. The equipment data 211 is the equipment data 211 of FIG. 2A. The procedure data 210 may include the equipment reference code 205, the equipment permit 270, a permit change history 275, one or more equipment statuses 280, one or more procedure identifiers 225, the tutorial identifier 296, and the simulation identifier 286. The equipment reference code 205 may index the equipment data 211 in the procedure database 125. In addition, the equipment reference code 205 may identify the equipment 160.

The equipment permit 270 may be issued by regulatory body. The equipment permit 270 may specify operational and/or maintenance requirements for the equipment 160, requirements for a operator of the equipment 160, safety requirements for equipment 160, environmental the equipment 160, reporting requirements for the equipment 160, and test procedures for the equipment 160.

The permit change history 275 may record changes to the equipment permit 270. The changes to the equipment permit 270 may be recorded automatically when the changes are made, such as by prompting for a description of the changes in response to a change entry. In one embodiment, the changes to the equipment permit 270 are manually entered from the workstation 135. In addition, the changes may be determined from a comparison of different versions of the equipment permit 270.

The equipment status 280 may record specific status information about the equipment 160. The equipment status 280 is described in more detail hereafter in FIG. 2D. One or more procedure identifiers 225 may identify equipment procedures 215 for the equipment 160. The tutorial identifier 296 identifies one or more equipment tutorials associated with the equipment 160 of the equipment data 211. The simulation identifier 286 may identify one or more simulations associated with the equipment procedure 215.

Figure 2D:
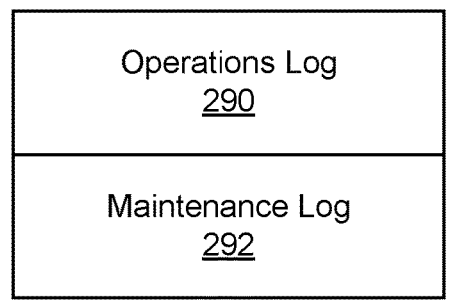
FIG. 2D is a schematic block diagram illustrating one embodiment of an equipment status.

FIG. 2D is a schematic block diagram illustrating one embodiment of an equipment status 280. The equipment status 280 is the equipment status 280 of FIG. 2C. In the depicted embodiment, the equipment status 280 includes an operations log 290 and a maintenance log 292. The operations log 290 may record events during operation of the equipment 160. The maintenance log 292 may record maintenance performed for the equipment 160.

Figure 2E:
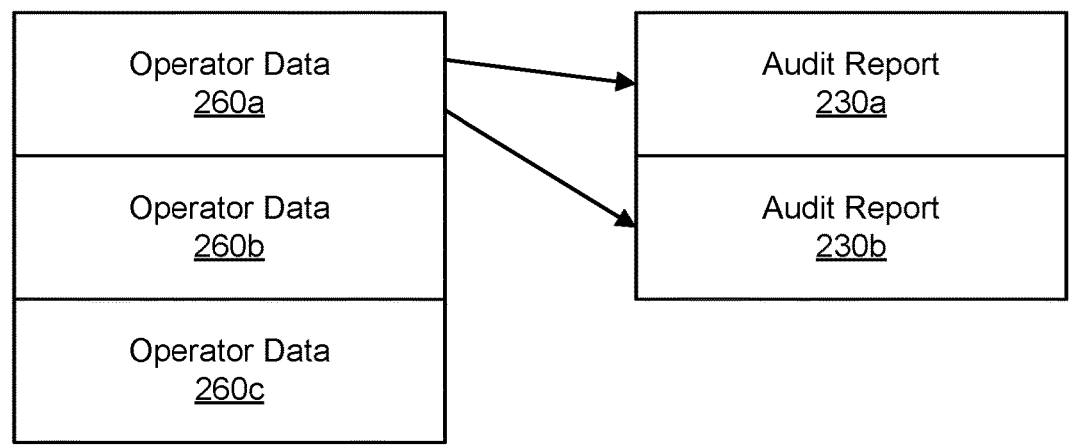
FIG. 2E is a schematic block diagram illustrating one embodiment of a operator database 140.

FIG. 2E is a schematic block diagram illustrating one embodiment of a operator database 140. The operator database 140 is the operator database 140 of FIG. 1. The operator database 140 may be organized as a plurality of tables. The operator database 140 includes operator data 260. The operator data 260 may include a operator name, a operator identifier such as employee number, a operator image, a biometric identifier, a signature, and the like. In one embodiment, one or more audit reports 230 are associated with the operator data 260.

FIG. 2F is a schematic block diagram illustrating one embodiment of an audit database 165. The audit database 165 is the audit database 165 of FIG. 1. The audit database 165 may store a plurality of audit reports 230 as will be described hereafter in FIG. 2F.

FIG. 2G is a schematic block diagram illustrating one embodiment of an audit report 230. The audit report 230 is the audit report 230 of FIGS. 2A, 2E, and 2F. The audit report 230 may be embodied in one or more tables, a data structure, and the like. The audit report 230 includes auditor data 232, an audit time 234, audit results 236, the operator identifier 238, an audit frequency 237, an attestation 240, an audit status 242, the equipment reference code 205, the procedure identifier 225, and/or audit issues 243.

The auditor data 232 may identify an auditor performing the audit. In one embodiment, the auditor is identified as the operator logging into the mobile device 105 to perform the audit. In one embodiment, the auditor may login to the mobile device 105 and select an audit option. An identifier for the auditor may be stored with the auditor data 232. The audit time 234 may be a timestamp indicating when the audit was started and/or completed.

The audit result 236 may describe the results of the audit. The audit results 236 may include a data structure encoding results of the audit, hypertext encoding results of the audit, a written description of results of the audit, a verbal description of results of the audit, and a video description of results of the audit, and combinations thereof. Elements of the audit results 236 may correspond to steps of an equipment process 215. In addition, elements of the audit results 236 may correspond to requirements of the equipment permit 270. The audit status 242 may summarize the audit such as with a "pass" or "fail" indication. Alternatively, the audit status 242 may summarize the audit such as with an "in process" indication.

In one embodiment, the operator identifier 238 identifies the operator performing operations and/or maintenance with the equipment 160. The operator identifier 238 may refer to the operator data 260.

The audit frequency 237 may specify a frequency for performing the audit. For example, the audit frequency 237 may specify that the audit be performed after a specified time interval such as every six months. Alternatively, the audit frequency 237 may specify that the audit be performed after a specified number of equipment procedures 215, such as after 10 equipment procedures 215.

The equipment reference code 205 is the equipment reference code 205 of FIG. 1. The procedure identifier 225 is the procedure identifier 225 of the equipment procedure 215 used with the equipment 160 that is being audited. The audit issues 243 may list issues arising from the audit that require correction.

The mobile device 105 may scan the equipment reference code 205 to identify the procedure data 210. The module device 105 may further scan an employee badge of the operator to capture the operator identifier 238. The mobile device 105 may also scan the procedure identifier 225 of the equipment 160.

The auditor may observe the operator complying with the requirements of the equipment permit 270. In addition, the auditor may observe the operator performing the equipment procedure 215 associated with the equipment reference code 205. The results of the audit are stored in the audit result 236 as will be described hereafter.

Figure 2H:
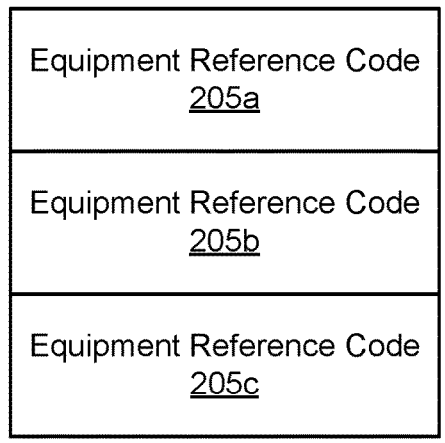
FIG. 2H is a schematic block diagram illustrating one embodiment of a site list.
Figure 2I:
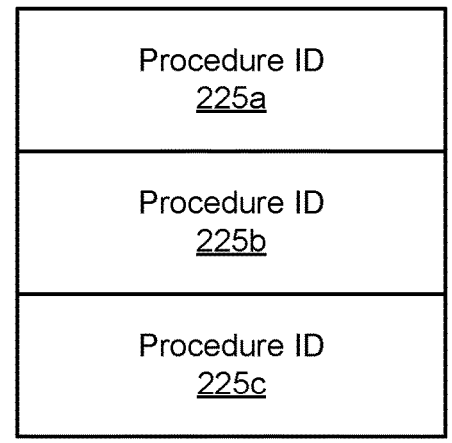
FIG. 2I is a schematic block diagram illustrating one alternate embodiment of the site list.

FIGS. 2H and 2I are a schematic block diagrams illustrating embodiments of site lists 262. In one embodiment, a first site list 262*a* lists the equipment reference codes 205 of equipment 160 at the specified site. Alternatively, a second site list 262*b* lists the procedure identifiers 225 of equipment 160 at the specified site. The site list 262 may be used to determine which equipment permits 270 and/or equipment procedures 215 are synchronized from the procedure database 125 to the mobile device 105. For example, only the equipment 160 group to a specific site list 262 may be synchronized from the procedure database 125 to the mobile device 105.

Figure 2J:
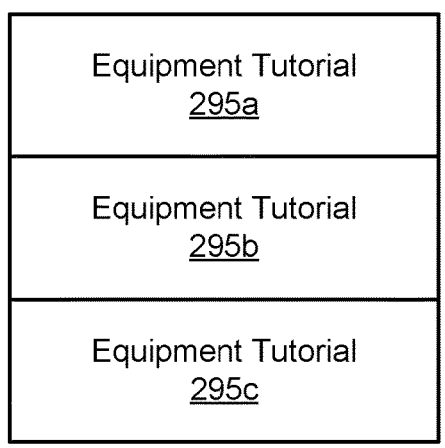
FIG. 2J is a schematic block diagram illustrating one embodiment of a tutorial database.

FIG. 2J is a schematic block diagram illustrating one embodiment of a tutorial database 170. This tutorial database 170 is the tutorial database 170 of FIG. 1. The tutorial database 170 stores a plurality of equipment tutorials 295. Each of the equipment tutorials 295 may include one or more of text instructions, hypertext instructions, audio instructions, video instructions, image instructions, and the like for performing one or more operations. An equipment tutorial 295 may be directed to a specific equipment instance 160. Alternatively, a tutorial 295 may be appropriate for multiple similar equipment instances 160.

Figure 2K:
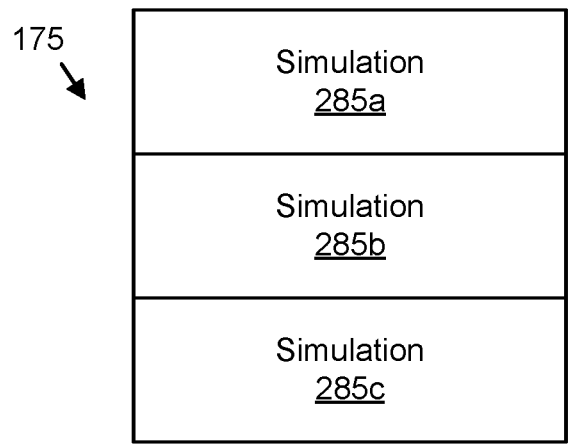
FIG. 2K is a schematic block diagram illustrating one embodiment of a simulation database.

FIG. 2K is a schematic block diagram illustrating one embodiment of a simulation database 175. The simulation database 175 may be stored in a memory such as a memory of the server 105 and/or a memory of the mobile device 105. The simulation database 175 may be organized as data structures, database tables, flat files, or combinations thereof. In the depicted embodiment, the simulation database 175 includes a plurality of simulations 285. The simulations 285 are described in more detail in FIG. 2L.

Figure 2L:
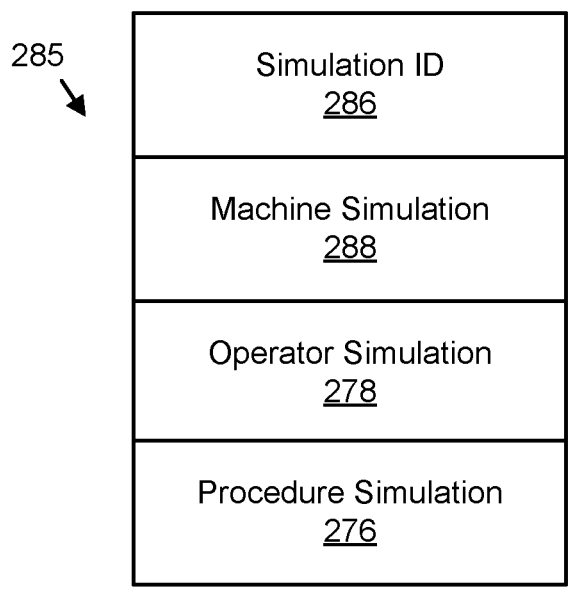
FIG. 2L is a schematic block diagram illustrating one embodiment of a simulation.

FIG. 2L is a schematic block diagram illustrating one embodiment of a simulation 285. The simulation 285 may be organized as data structures, database tables, flat files, or combinations thereof. In the depicted embodiment, the simulation 285 includes a simulation identifier 286, a machine simulation 288, an operator simulation 278, and a procedure simulation 276.

The machine simulation 288 may simulate the equipment instance 160. The machine simulation 288 is described in more detail in FIG. 2Q. The operator simulation 278 may simulate an operator for the equipment instance. The operator simulation 278 is described in more detail in FIG. 2R. The procedure simulation 276 may simulate performing the equipment procedure 215. The procedure simulation 276 may be used as part of the equipment tutorial 295.

Figure 2M:
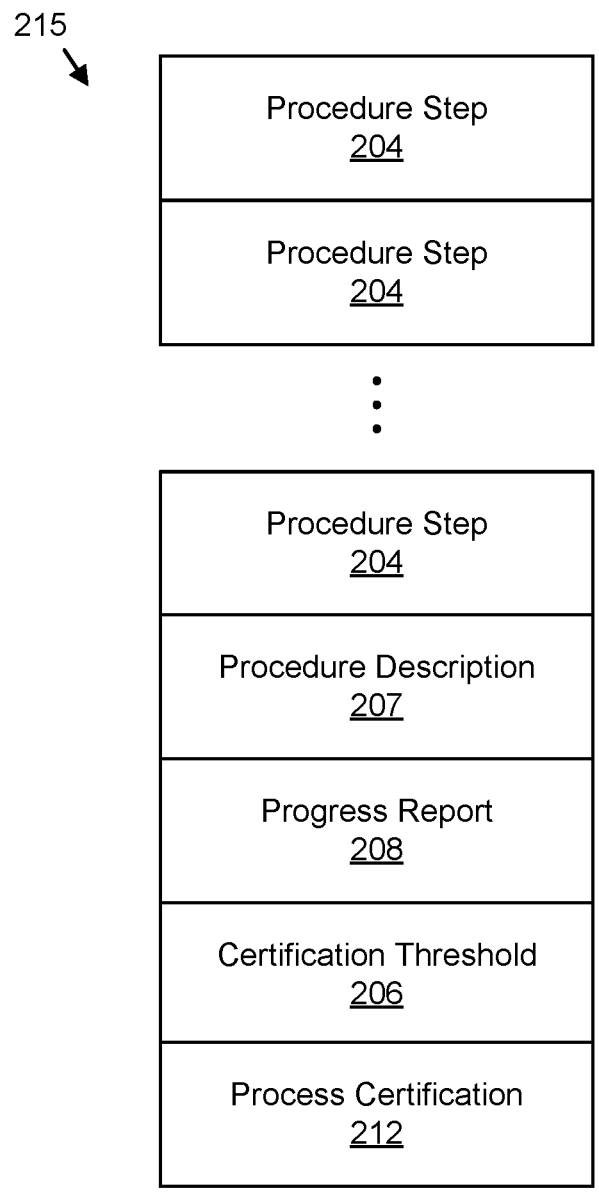
FIG. 2M is a schematic block diagram illustrating one embodiment of an equipment procedure.

FIG. 2M is a schematic block diagram illustrating one embodiment of an equipment procedure 215. The equipment procedure 215 may be stored in a memory such as a memory of the server 105 and/or a memory of the mobile device 105. The equipment procedure 215 may be organized as data structures, database tables, flat files, or combinations thereof. In the depicted embodiment, the equipment procedure 215 includes one or more procedure steps 204, a procedure description 207, a progress report 208, a certification threshold 206, and a process certification 212.

Each procedure step 204 may train, illustrate, and test the operator on a step of the equipment procedure 215 for the equipment instance 160. The equipment procedure 215 may include a plurality of procedure steps 204.

The procedure description 207 may describe the equipment procedure 215 that is to be performed on the equipment instance 160. The procedure description 207 may be presented in the form of a work order. Alternatively, the procedure description 207 may be presented in the form of audio and/or video instructions to the operator to initiate the equipment procedure 215

The progress report 208 may detail the operator's performance while training to perform the procedure. The progress report 208 may be based on lockout decisions and/or step answers made by the operator as part of the training. The progress report 208 may include a process score for the equipment process 215. In addition, the progress report 208 may include a step score for each procedure step 204.

The certification threshold 206 may indicate performance levels on lockout decisions, step answers, and other training activities that must be satisfied for the operator to perform the process on the equipment instance 160. In one embodiment, the certification threshold 206 includes a lockout decision threshold, a step answer threshold, and an attendance threshold. One of skill in the art will recognize that other criteria may be included in the certification threshold 206.

The process certification 212 may indicate that the operator's performance in the training for the equipment process 215 exceeds the certification threshold 206. In one embodiment, the process certification 212 may be formatted to satisfy a regulatory requirement.

Figure 2N:
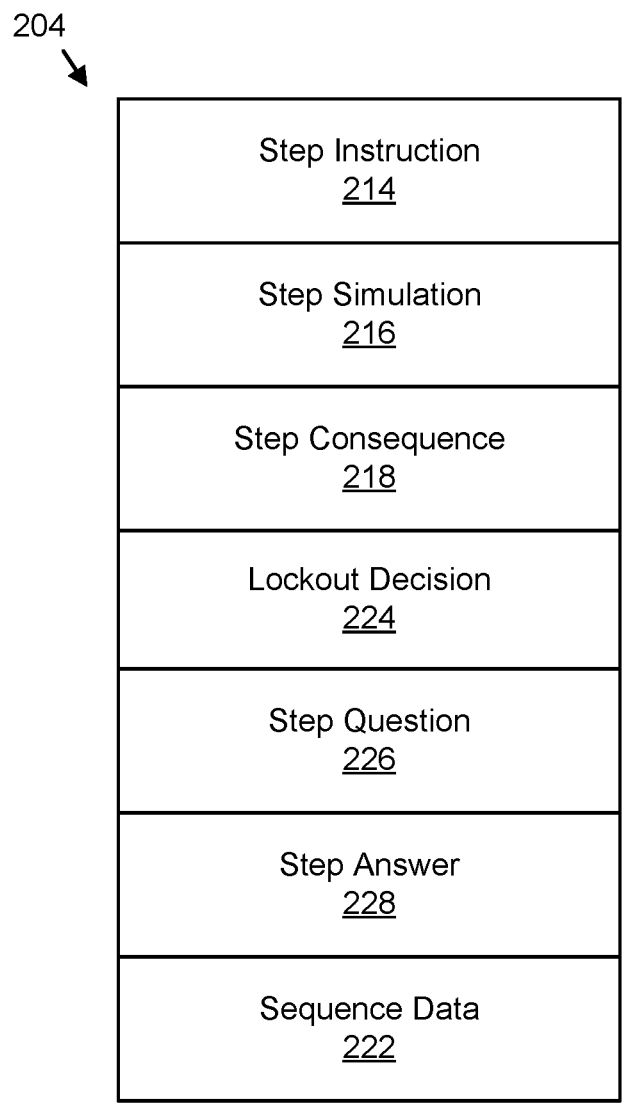
FIG. 2N is a schematic block diagram illustrating one embodiment of a procedure step.

FIG. 2N is a schematic block diagram illustrating one embodiment of a procedure step 204. The procedure step 204 may be stored in a memory such as a memory of the server 105 and/or a memory of the mobile device 105. The procedure step 204 may be organized as data structures, database tables, flat files, or combinations thereof. In the depicted embodiment, the procedure step 204 includes a step instruction 214, a step simulation 216, a step consequence 218, a lockout decision 224, a step question 226, a step answer 228, and sequence data 222.

The step instruction 214 may include one or more of written instructions, audio instructions, visual instructions, instructor notes, simulated instructions, and the like. In one embodiment, the step instruction 214 includes portions of the procedure simulation 276. The step instruction 214 may illustrate and explain how to perform the procedure step S204 of the process. In one embodiment, the operator may receive the step instruction 205 through the mobile device 105. Alternatively, the operator may receive the step instruction 205 through the equipment instance 160.

The step simulation 216 may specify how the machine simulation 288 and the operator simulation 278 interact to simulate performing the procedure step 204 on the equipment instance 160. For example, the step simulation 216 may specify motions of the operator simulation 278 and the resulting motions of the machine simulation 288. Alternatively, the step simulation 216 may include one or more still images and/or one or more video images of showing performing the procedure step 204 on the equipment instance 160. The step simulation 216 may be displayed on the mobile device 105.

The lockout decision 224 may include one or more decisions that may be made by the operator in response to the procedure description 207. At least one lockout decision 224 may indicate that the procedure step 204 requires a lockout of the equipment instance 160. In addition, at least one lockout decision 224 may indicate that the procedure step 204 does not require a lockout of the equipment instance 160. The lockout decision 224 is described in more detail in FIG. 2O.

The step consequence 218 may include one or more step consequences 218. In one embodiment, there is a step consequence 218 associated with each lockout decision 224. The step consequence 218 may be a computer simulated consequence that shows the consequence to the operator simulation 278 from the machine simulation 288 of acting in accordance with the lockout decision 224 on the equipment instance 160. Alternatively, the step consequence 218 may be a video consequence that shows the consequence of acting in accordance with a lockout decision 224 on the equipment instance 160. In one embodiment, the step consequence 218 may be electrical arcing, a gas leak, a fire, or the like. Each step consequence 218 may show consequences of the procedure step 204.

The step question 226 is a question about the procedure step 204. The step question 226 may be related to instructional material in the step instruction 214 and/or the equipment tutorial 295. The step question 226 may be used to test the operator's understanding of the step instruction 214 and/or the equipment tutorial 295. The step answer 228 may include one or more answers for a step question 226. In one embodiment, there at least two step answers 228 for every step question 226.

The sequence data 222 may indicate one or more orders of presentation for the procedure steps 204. For example, the sequence data 222 may indicate the predecessor procedure steps 204 and the subsequent procedure steps 204 for each procedure step 204. In addition, the sequence data 222 may indicate the subsequent procedure steps 204 for each step answer 228.

Figure 2O:
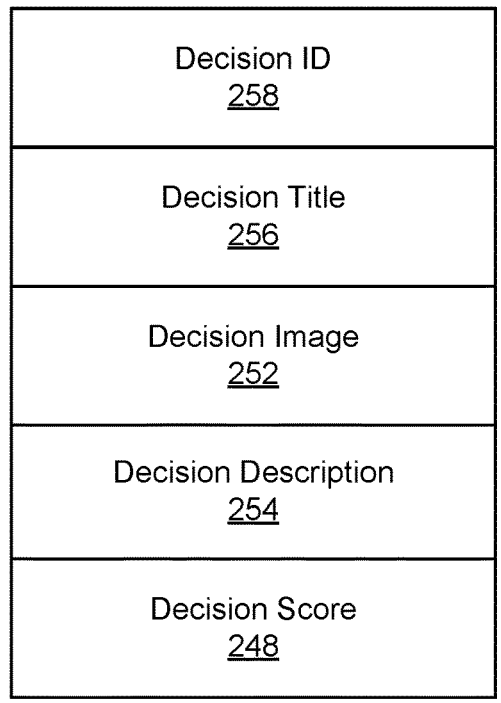
FIG. 2O is a schematic block diagram illustrating one embodiment of a lockout decision.

FIG. 2O is a schematic block diagram illustrating one embodiment of a lockout decision 224. The lockout decision 224 may be organized as a data structure, database table, flat file, or combinations thereof. The lockout decision 224 may include a decision identifier 258, a decision title 256, a decision image 252, a decision description 254, and/or a decision score.

The decision identifier 258 may uniquely identify the lockout decision 224. The decision identifier 258 may be an index. The decision title 256 may identify the lockout decision 224 to the operator.

The decision image 252 may include a still image and/or a video image illustrating the lockout decision 224. Alternatively, the decision image 252 may employ the procedure simulation 276 to illustrate the procedure step 204. The decision description 254 may describe the lockout decision 224. The decision score 248 may indicate a correctness of the lockout decision 224 in response to the step simulation 216.

Figure 2P:
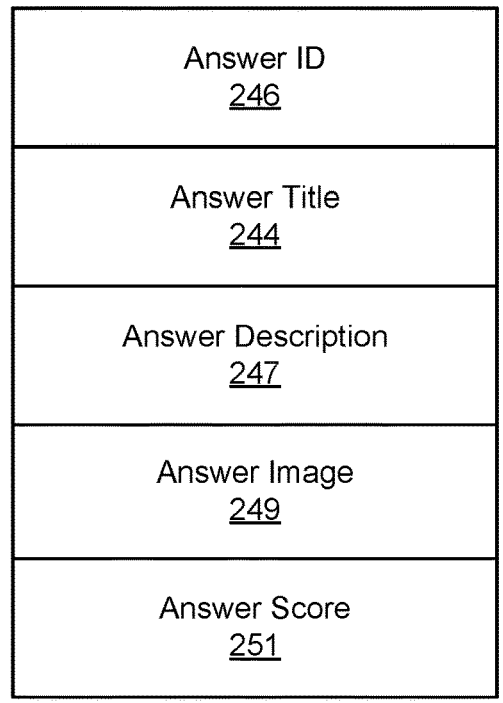
FIG. 2P is a schematic block diagram illustrating one embodiment of a step answer.

FIG. 2P is a schematic block diagram illustrating one embodiment of the step answer 228. The step answer 228 may be organized as a data structure, database table, flat file, or combinations thereof. Each step answer 228 may include an answer identifier 246, an answer title 244, an answer description 247, an answer image 249, and an answer score 251.

The answer identifier 246 may uniquely identify the step answer 228. The answer identifier 246 may be an index. The answer title 244 may briefly identify the step answer 228 to the operator. The answer description 247 may provide a more detailed explanation of the step answer 228. The answer image 249 may be a still image and/or a video image that illustrates the step answer 228. Alternatively, the answer image 249 may employ the procedure simulation 276 to illustrate the step answer 228. The answer score 251 may indicate a correctness of the step answer 228.

Figure 2Q:
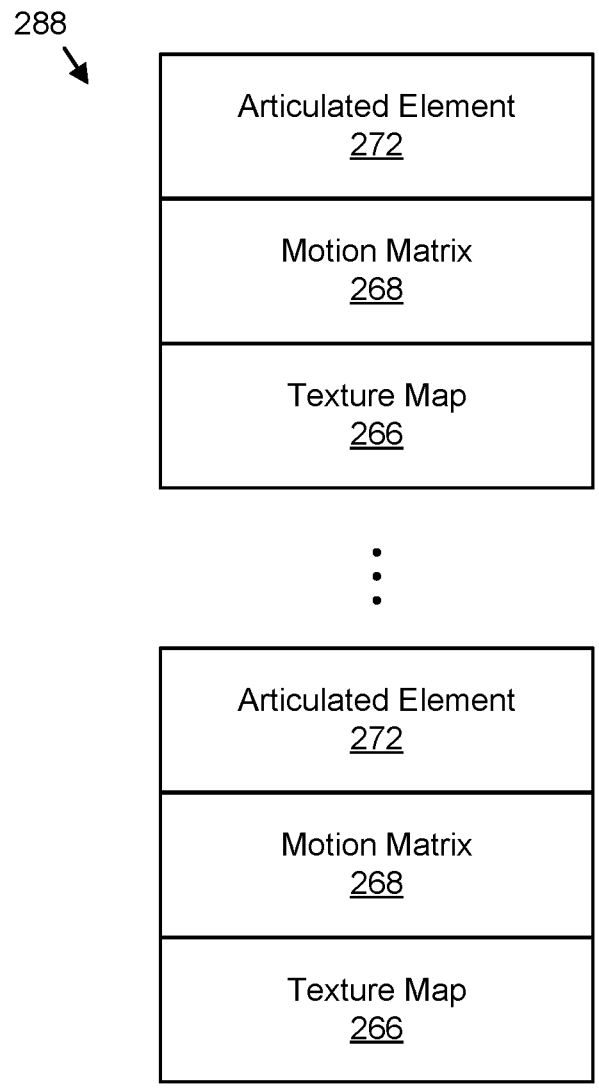
FIG. 2Q is a schematic block diagram illustrating one embodiment of a machine simulation.

FIG. 2Q is a schematic block diagram illustrating one embodiment of a machine simulation 288. The machine simulation 288 may be organized as a data structure, a database table, flat file, or combinations thereof. The machine simulation 288 may be stored in the server 120 and/or the mobile device 105. The machine simulation 288 includes an articulated element 272, a motion matrix 268, and a texture map 266. In one embodiment, the machine simulation 288 includes the articulated element 272, the motion matrix 268, and the texture map 266 for each element of the equipment 160 with independent motion.

The articulated element 272 may describe the dimensions of an element of the equipment 160 as an element model. The articulated element 272 may be generated from a three-dimensional description.

The motion matrix 268 may describe the motion of the articulated element 272 relative to other articulated elements 272 of the equipment 160. The motion matrix 268 may describe one or more degrees of freedom, one or more limits of motion, one or more motion velocities, one or more motion accelerations, and the like.

The texture map 266 may be generated from an image of the element of the equipment 160. The texture map 266 may be applied to the element model described by the articulated element 272 to generate the machine simulation 288. The element model may be moved in accordance with the motion matrix 268 to simulate motion of the element of the equipment instance 160.

Figure 2R:
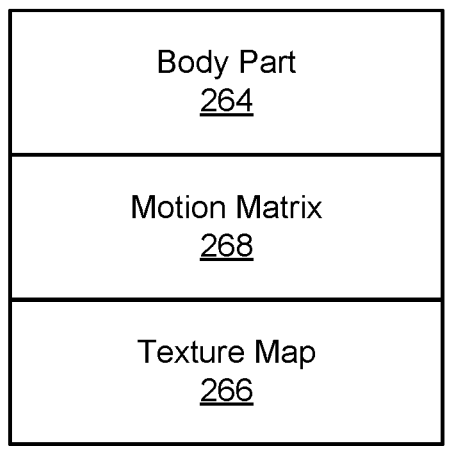
FIG. 2R is a schematic block diagram illustrating one embodiment of an operator simulation.
Figure 2R:
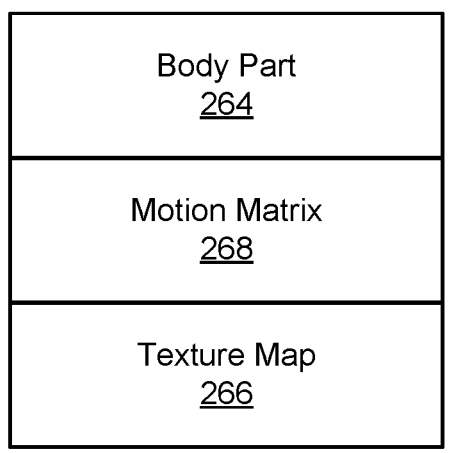

FIG. 2R is a schematic block diagram illustrating one embodiment of an operator simulation 278. The operator simulation 278 may be organized as a data structure, a database table, flat file, or combinations thereof. The operator simulation 278 may be stored in the server 120 and/or the mobile device 105. The operator simulation 278 includes a body part 264, the motion matrix 268, and the texture map 266. In one embodiment, the operator simulation 278 includes a body part 264, a motion matrix 268, and a texture map 266 for each element of the body that moves independently relative to other elements.

The body part 264 may describe an element model of the human body. The body part 264 may be based on standard human dimensions. In addition, the body part 264 may be scaled based on a height and/or weight of an operator.

The motion matrix 268 may describe the motion of the body part 264 relative to other body parts 264. The motion matrix 268 may describe one or more degrees of freedom, one or more limits of motion, one or more motion velocities, one or more motion accelerations, and the like.

The texture map 266 may be generated from an image of an operator. The texture map 266 may be applied to the element model described by the body part 264 to generate the operator simulation 278. The element model may be moved in accordance with the motion matrix 268 to simulate a motion of the operator.

Figure 3A:
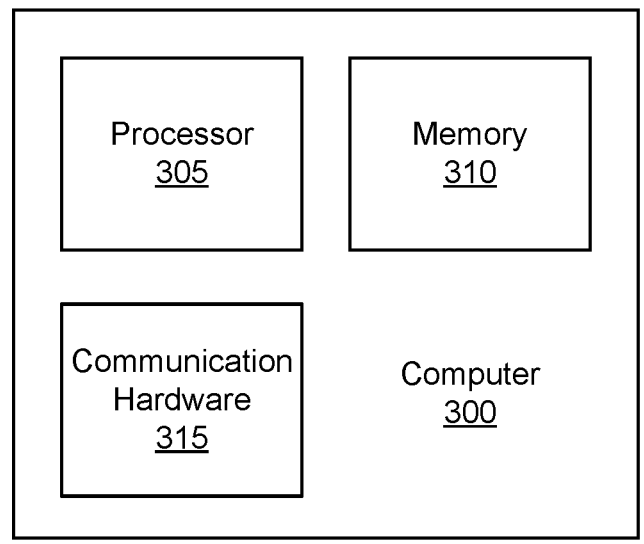
FIG. 3A is a schematic block diagram illustrating one embodiment of a computer.

FIG. 3A is a schematic block diagram illustrating one embodiment of the computer 300. The computer 300 may be the server 120 of FIG. 1. Alternatively, the computer 300 may be the mobile device 105 and/or the workstation 135 of FIG. 1. The computer 300 includes a processor 305, a memory 310, and communication hardware 315. The memory 310 may be a computer readable storage medium such as a semiconductor storage device, a hard disk drive, an optical drive, a holographic storage device, a micromechanical storage device, or combinations thereof. The memory 310 may store program code. The processor 305 may execute the program code. The communication hardware 315 may communicate with other devices.

Figure 3B:
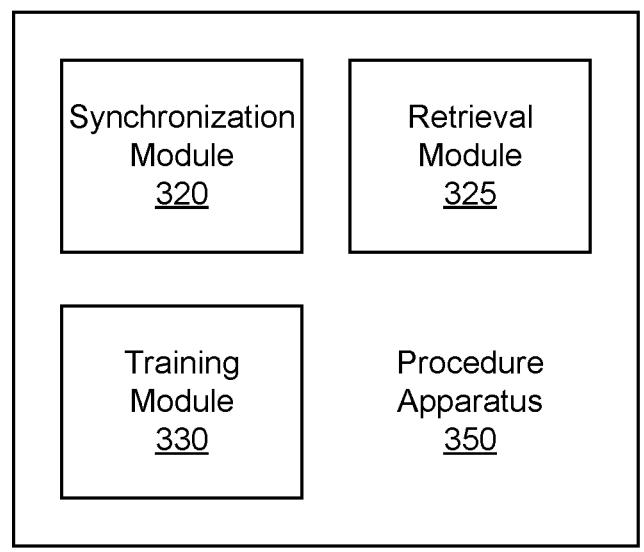
FIG. 3B is a schematic block diagram illustrating one embodiment of a procedure apparatus.

FIG. 3B is a schematic block diagram illustrating one embodiment of the procedure apparatus 350. The apparatus 350 may be embodied in the computer 300. In one embodiment, the apparatus 350 is embodied in the server 120, the mobile device 105, or combinations thereof. The apparatus 350 includes a synchronization module 320, a retrieval module 325, and a training module 330. The synchronization module 320, the retrieval module 325, and the training module 330 may be embodied in a computer readable storage medium such as the memory 310 storing program code that is executed by the processor 305.

The synchronization module 320 may store a plurality of equipment procedures 215 and/or a plurality of equipment permits 270 in the procedure database 125. Each equipment procedure 215 corresponds to an equipment instance 160 of a plurality of equipment instances 160 and each equipment instance 160 corresponds to an equipment reference code 205. In addition, the synchronization module 320 may synchronize one or more of the plurality of equipment procedures 215 and/or equipment permits 270 to the mobile device 105.

The retrieval module 325 may receive the equipment reference code 205 at the mobile device 105. In addition, the retrieval module 325 may retrieve the equipment procedure 215 and/or equipment permit 270 indexed to the equipment reference code 205. In one embodiment, the retrieval module 325 retrieves the equipment procedure 215 and/or equipment permit 270 from the mobile device 105. Additional functions of the apparatus 350 are described hereafter.

The training module 330 may train the operator to perform an equipment procedure 215. Training the operator may include receiving a procedure step 204 directed to the machine simulation 288. The training module 330 may also display a step consequence 218 depicting the operator simulation 278 interacting with the machine simulation 288 in response to the procedure step 204 as will be described hereafter.

Embodiment Methods

Figure 4A:
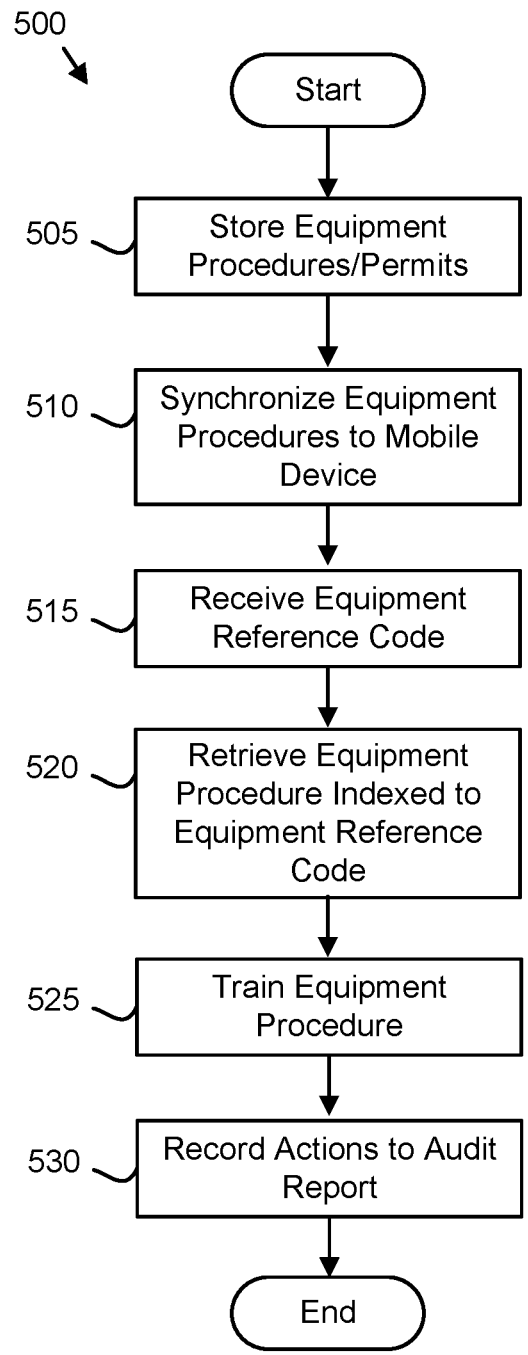
FIG. 4A is a schematic flow chart diagram illustrating one embodiment of a step consequence display method.

FIG. 4A is a schematic flow chart diagram illustrating one embodiment of a step consequence display method 500. The method 500 may display a step consequence 218 to train an operator. The method 500 may perform the functions of the system 100 and apparatus 350. In one embodiment, the method 500 is performed by a computer readable storage medium such as the memory 310 storing program code. The program code may be executed by the processor 305 to perform the functions of the method 500.

The method 500 starts, and in one embodiment the synchronization module 320 stores 505 a plurality of equipment procedures 210 and/or a plurality of equipment permits 270 in a procedure database 125. Each equipment procedure 215 may be indexed with a procedure identifier 225 indexed to an equipment reference code 205. In addition, each equipment permit 270 may be indexed with an equipment reference code 205.

The synchronization module 320 may synchronize 510 an equipment procedure 215 and/or equipment permit 270 from the procedure database 125 to the mobile device 105. In addition, the procedure data 210 and/or equipment data 211 associated with the equipment procedure 215 and/or equipment permit 270 may be synchronized from the procedure database 125 to the mobile device 105. In one embodiment, all equipment procedures 215 and/or equipment permits 270 are synchronized from the procedure database 125 to the mobile device 105.

In an alternative embodiment, only equipment procedures 215 and/or equipment permits 270 with equipment reference codes 205 and/or procedure identifiers 225 of a site list 262 are synchronized 510 to the mobile device 105. The equipment procedures 215 may be grouped by site with a site list 262 for each site. A first site list 262 for a first site may include the equipment reference code 205 and/or procedure identifier 225 corresponding to the equipment reference code 205 that is received by the mobile device 105.

The synchronization module 320 may synchronize 510 the equipment procedures 215 and/or equipment permits 270 grouped to the first site in response to the first equipment reference code 205 corresponding to equipment 160 of the first site. Alternatively, the synchronization module 320 may synchronize 510 the equipment procedures 215 and/or equipment permits 270 of the first site list 262 to the mobile device 105 if the first equipment reference code 205 and/or a procedure identifier 225 corresponding to the first equipment reference code 205 is included in the first site list 262. In one embodiment, the equipment procedures 215 and/or equipment permits 270 are synchronized 510 when the mobile device 105 is in communication with the network 115.

The retrieval module 325 receives 515 the equipment reference code 205. In one embodiment, the retrieval module 325 is embodied in the mobile device 105 and scans a QR code equipment reference code 205 affixed to the equipment 160. Alternatively, the retrieval module 325 may receive 515 the equipment reference code 205 by scanning a barcode, receiving the equipment reference code 205 wirelessly, and/or by scanning human readable text. The retrieval module 325 may convert the scanned QR code, the scanned barcode, the human readable text, and/or the received equipment reference code 205 into a digital string embodying the equipment reference code 205.

The retrieval module 325 may retrieve 520 the equipment procedure 215 and/or equipment permit 270 corresponding to the equipment reference code 205 that is stored on the mobile device 105. In one embodiment, the retrieval module 325 uses the retrieval code 205 is an index to access the procedure identifiers 225 and/or equipment permit 270 for the equipment reference code 205. The retrieval module 325 may further use the procedure identifiers 225 associated with the equipment reference code 205 to retrieve the equipment procedure 215. The equipment procedure 215 may include a simulation 285 including the machine simulation 288 and/or procedure simulation 276 for the equipment 160.

If the equipment procedure 215 and/or equipment permit 270 corresponding to the equipment reference code 205 are not stored on the mobile device 105, the retrieval module 325 may use the equipment reference code 205 and/or corresponding procedure identifiers 225 to request the equipment procedure 215 and/or equipment permit 270 from the server 120 over the network 115.

The training module 330 may train 525 the equipment procedure 215. In one embodiment, the training module 330 trains 525 an operator in the use of the equipment procedure 215 and/or the equipment permit 270. The training 525 of the equipment procedure 215 is described in more detail in FIG. 4F.

In one embodiment, actions taken by the operator are recorded 530 to the audit report 230 and the method 500 ends. An auditor may record the actions on the mobile device 105 or the second device. Alternatively, the operator may self-audit, and record the actions on the mobile device 105. Recording 530 the actions taken by the operator to the audit report 230 is described in more detail in FIG. 4D.

Figure 4B:
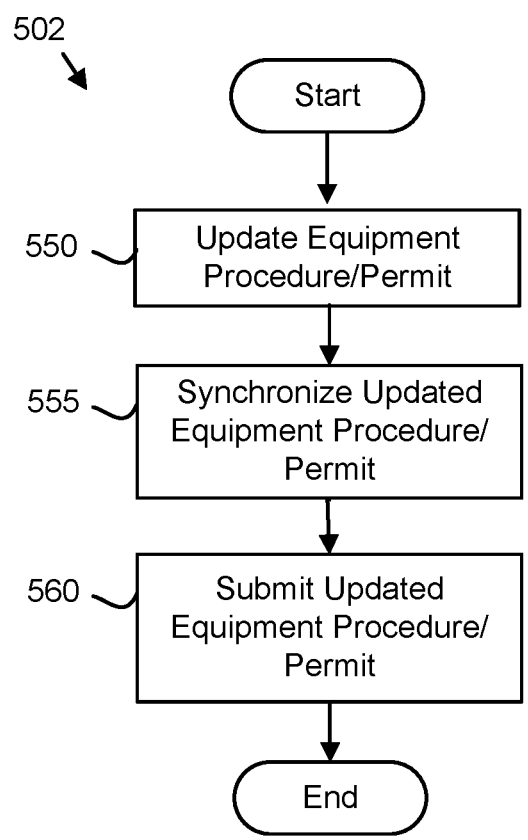
FIG. 4B is a schematic flow chart diagram illustrating one embodiment of an update method.

FIG. 4B is a schematic flowchart diagram illustrating one embodiment of an update method 502. The method 502 may update an equipment permit 270 and/or an equipment procedure 215. The method 502 may perform the functions of the system 100 and apparatus 350. In one embodiment, the method 502 is performed by a computer readable storage medium such as the memory 310 storing program code. The program code may be executed by the processor 305 to perform the functions of the method 502.

The method 502 starts, and in one embodiment, the retrieval module 325 updates 550 an equipment procedure 215 and/or equipment permit 270. The update may be entered by an operator. The update may be entered from the mobile device 105. Alternatively, the update may be entered from the workstation 135. The synchronization module 320 may synchronize 555 the updated equipment procedure 215 and/or updated equipment permit 270 to the procedure database 125. In one embodiment, the updated equipment procedure 215 and/or updated equipment permit 270 may overwrite a previous equipment procedure 215 and/or a previous equipment permit 270. Alternatively, the updated equipment procedure 215 and/or updated equipment permit 270 may be appended to the procedure data 210 and/or equipment data 211. In addition, the updated equipment procedure 215 and/or updated equipment permit 270 may be synchronize 555 from the procedure database 125 to other mobile devices 105

In one embodiment, the server 120 may submit 560 the updated equipment procedure 215 and/or updated equipment permit 270 to a regulatory authority such as the Occupational Safety and Health Administration and the method 502 ends. In one embodiment, the updated equipment procedure 215 and/or updated equipment permit 270 are submitted as extended markup language (XML) files.

Figure 4C:
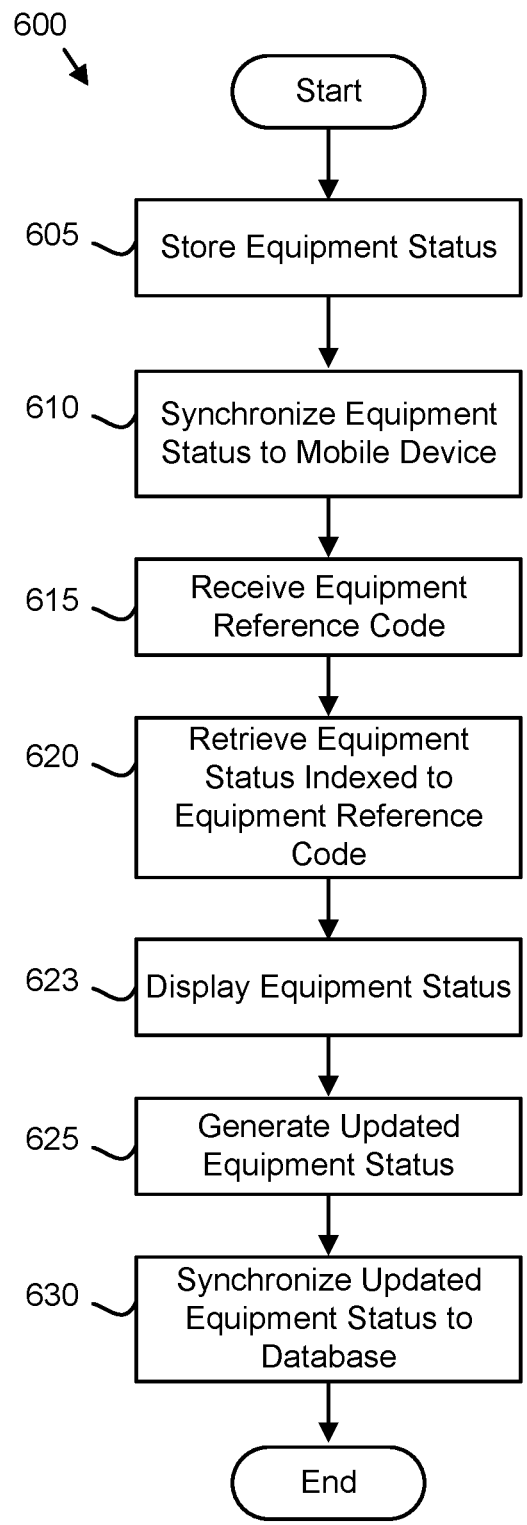
FIG. 4C is a schematic flow chart diagram illustrating one embodiment of a status provision method.

FIG. 4C is a schematic flow chart diagram illustrating one embodiment of a status provision method 600. The method 600 may provide and/or update an equipment status 280. The method 600 may perform the functions of the system 100 and apparatus 350. In one embodiment, the method 600 is performed by a computer readable storage medium such as the memory 310 storing program code. The program code may be executed by the processor 305 to perform the functions of the method 600.

The method 600 starts, and in one embodiment the synchronization module 320 stores 605 a plurality of equipment statuses 280 in a procedure database 125. Each equipment status 280 may be stored as part of equipment data 211.

The synchronization module 320 may synchronize 610 an equipment status 280 from the procedure database 125 to the mobile device 105. In one embodiment, all equipment statuses 280 are synchronized 610 from the procedure database 125 to the mobile device 105. In an alternative embodiment, only equipment statuses 280 corresponding to equipment reference codes 205 and/or procedure identifiers 225 of a site list 262 are synchronized 610 to the mobile device 105. For example, the equipment statuses 280 of a first site list 262 that includes the equipment reference code 205 and/or procedure identifiers 225 corresponding to the equipment reference code 205 may be synchronized 610 to the mobile device 105. In one embodiment, the equipment statuses 280 are synchronized 610 when the mobile device 105 is in communication with the network 115.

The retrieval module 325 receives 615 the equipment reference code 205. In one embodiment, the retrieval module 325 embodied in the mobile device 105 scans a QR code equipment reference code 205 affixed to the equipment 160. Alternatively, the retrieval module 325 may receive 615 the equipment reference code 205 by scanning a barcode, receiving the equipment reference code 205 wirelessly, or by scanning human readable text. The retrieval module 325 may convert the scanned QR code, the scanned barcode, the human readable text, and/or the received equipment reference code 205 into a digital string of the equipment reference code 205.

The retrieval module 325 may retrieve 620 the equipment status 280 corresponding to the equipment reference code 205 that is stored on the mobile device 105. In one embodiment, the retrieval module 325 uses the equipment reference code 205 as an index to access the equipment status 280. If the equipment status 280 corresponding to the equipment reference code 205 is not stored on the mobile device 105, the retrieval module 325 may use the equipment reference code 205 to request the equipment status 280 from the server 120 over the network 115. The equipment status 280 may be displayed 623 on the mobile device 105. Alternatively, the equipment status 280 may be communicated to a second device.

The retrieval module 325 may generate 625 an update of the equipment status 280. The operator may enter the update on the mobile device 105. Alternatively, the update may be generated 625 in response to the operator indicating that a portion of the equipment procedure 215 is completed. In one embodiment, the update to the equipment status 280 may be generated 625 from the audit report 230.

The synchronization module 320 may synchronize 630 the updated equipment status 280 to the procedure database 125 and the method 600 ends. In one embodiment, the updated equipment status 280 overwrites a previous equipment status 280 in the procedure database 125. Alternatively, the updated equipment status 280 is appended to the equipment data 211 for the equipment 160 in the procedure database 125.

Figure 4D:
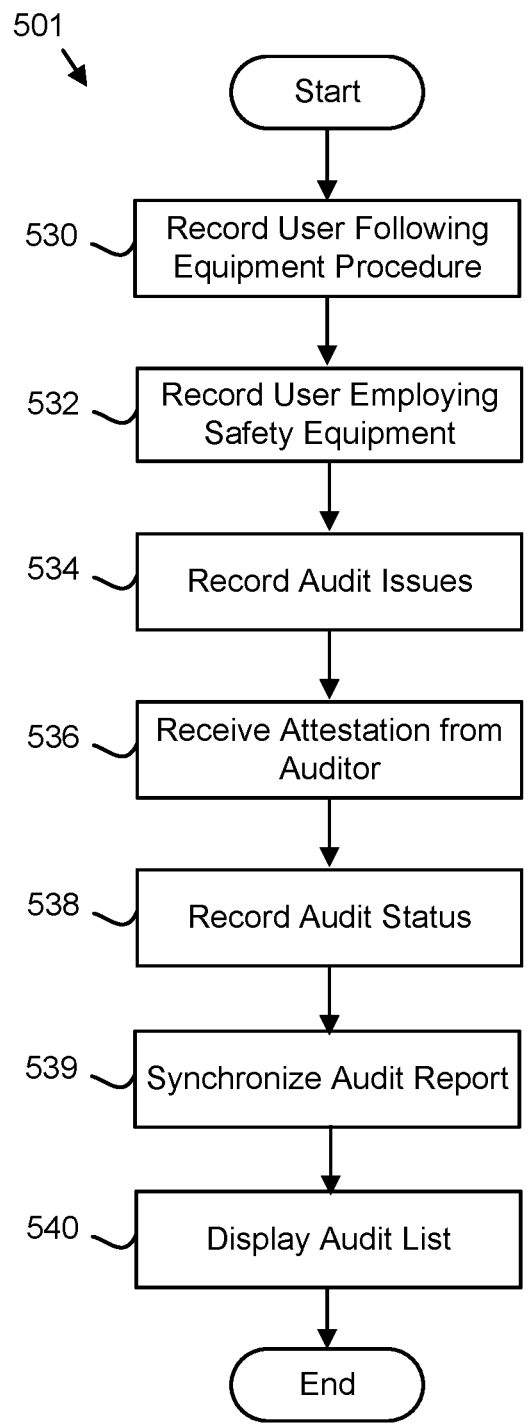
FIG. 4D is a schematic flow chart diagram illustrating one embodiment of an audit method.

FIG. 4D is a schematic flowchart diagram illustrating one embodiment of an audit method 501. The method 501 may audit performance of an equipment procedure 215. The method 501 may perform the functions of the system 100 and apparatus 350. In one embodiment, the method 501 is performed by a computer readable storage medium such as the memory 310 storing program code. The program code may be executed by the processor 305 to perform the functions of the method 501.

The method 501 starts, and in one embodiment the retrieval module 325 records 530 an operator following and/or performing an equipment procedure 215. The retrieval module 325 may record 530 the following and/or performing of the equipment procedure 215 to the audit result 236 of an audit report 230. The retrieval module 325 may further record 530 the auditor performing the audit to the auditor data 232 and the operator identifier 238 of the operator.

In one embodiment, the retrieval module 325 records 532 if the operator employs safety equipment specified by the equipment procedure 215 and/or equipment permit 270 to the audit result 236. For example, the equipment procedure 215 may specify the use of safety equipment such as eye protection. The retrieval module 325 may record 532 if the specified safety equipment is used as part of the equipment procedure 215.

The retrieval module 325 may record 534 audit issues 243 for the equipment procedure 215 and/or equipment permit 270 to the audit results 236. The audit issues 243 may include that the equipment 160 is incorrectly marked, that the equipment 160 lacks the required safety equipment, that the equipment 160 is improperly ventilated, that the equipment 160 lacks a physical copy of the equipment procedure 215 and/or equipment permit 270, that the steps of the equipment procedure 215 and/or equipment permit 270 were incorrectly followed, that the operator was improperly trained, and the like.

In one embodiment, the retrieval module 325 records 536 an attestation from the auditor. The attestation may be an electronic signature, a biometric identifier, the signature image, or combinations thereof. The retrieval module 325 may further record 538 an audit status 242 that may indicate if the equipment procedure 215, equipment 160, operator, or combinations thereof passed the audit.

The synchronization module 320 may synchronize 539 the audit report 230 to the audit database 165. The audit report 230 may be associated with the procedure data 210 and/or the equipment data 211. In addition, the synchronization module 320 may associate the audit report 230 with the operator data 260 of the operator.

In one embodiment, the retrieval module 325 displays 540 an audit list of the audit statuses 242 for each equipment instance 160 and the method 501 ends. The retrieval module 325 may also display 540 the audit status 242 for one or more operators. In addition, the audit list may include one or more of the audit issues 243, the equipment statuses 280, and the procedure statuses 217. The audit list may be displayed 540 for a site list 262. Alternatively, the retrieval module 325 displays 540 a summary of the audit status for all operators. The summary of the audit statuses 242 may be used to show compliance with one or more regulations.

Figure 4E:
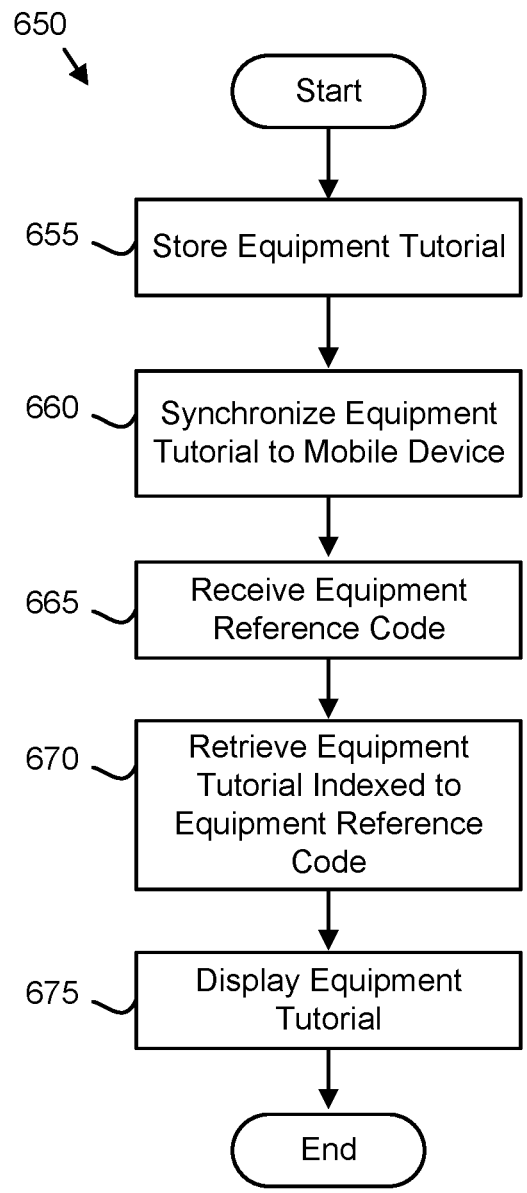
FIG. 4E is a schematic flow chart diagram illustrating one embodiment of a tutorial provision method.

FIG. 4E is a schematic flow chart diagram illustrating one embodiment of a tutorial provision method 650. The method 650 may provide equipment tutorials 295 for an equipment procedure 215 and/or equipment permit 270. The method 650 may perform the functions of the system 100 and apparatus 350. In one embodiment, the method 650 is performed by a computer readable storage medium such as the memory 310 storing program code. The program code may be executed by the processor 305 to perform the functions of the method 650.

The method 650 starts, and in one embodiment the synchronization module 320 stores 655 a plurality of equipment tutorials 295 in the tutorial database 170. Each equipment tutorial 295 may be indexed with an equipment reference code 205. Alternatively, each equipment tutorial 295 may be indexed with a procedure identifier 225.

The synchronization module 320 may synchronize 660 an equipment tutorial 295 from the procedure database 125 to the mobile device 105. In one embodiment, all equipment tutorials 295 are synchronized from the procedure database 125 to the mobile device 105. In an alternative embodiment, only equipment tutorial 295 corresponding to equipment reference codes 205 and/or procedure identifiers 225 of a site list 262 are synchronized 510 to the mobile device 105. For example, the equipment tutorials 295 corresponding of a first site list 262 that includes the equipment reference code 205 and/or procedure identifiers 225 corresponding to the equipment reference code 205 may be synchronized 660 to the mobile device 105. In one embodiment, the tutorials 295 are synchronized when the mobile device 105 is in communication with the network 115.

The retrieval module 325 receives 665 the equipment reference code 205. In one embodiment, the retrieval module 325 embodied in the mobile device 105 scans a QR code equipment reference code 205 affixed to the equipment 160. Alternatively, the retrieval module 325 may receive 665 the equipment reference code 205 by scanning a barcode, receiving the equipment reference code 205 wirelessly, or by scanning human readable text. The retrieval module 325 may convert the scanned QR code, the scanned barcode, the human readable text, and/or the received equipment reference code 205 into a digital string for the equipment reference code 205.

The retrieval module 325 may retrieve 670 the equipment tutorial 295 corresponding to the equipment reference code 205 that is stored on the mobile device 105. In one embodiment, the retrieval module 325 uses the retrieval code 205 is an index to access the equipment tutorial 295. If the equipment tutorial 295 corresponding to the equipment reference code 205 is not stored on a mobile device 105, the retrieval module 325 may use the equipment reference code 205 to request the equipment tutorial 295 from the server 120 over the network 115.

The equipment tutorial 295 may be displayed 675 on the mobile device 105 and the method 650 ends. In one embodiment, the procedure simulation 276 is referenced to show the operator simulation 278 interacting with the machine simulation 288 to perform an equipment procedure 215.

In one embodiment, the equipment tutorial 295 may be communicated to a second device. In one embodiment, a review of the equipment tutorial 295 by the operator is recorded to the audit report 230.

Figure 4F:
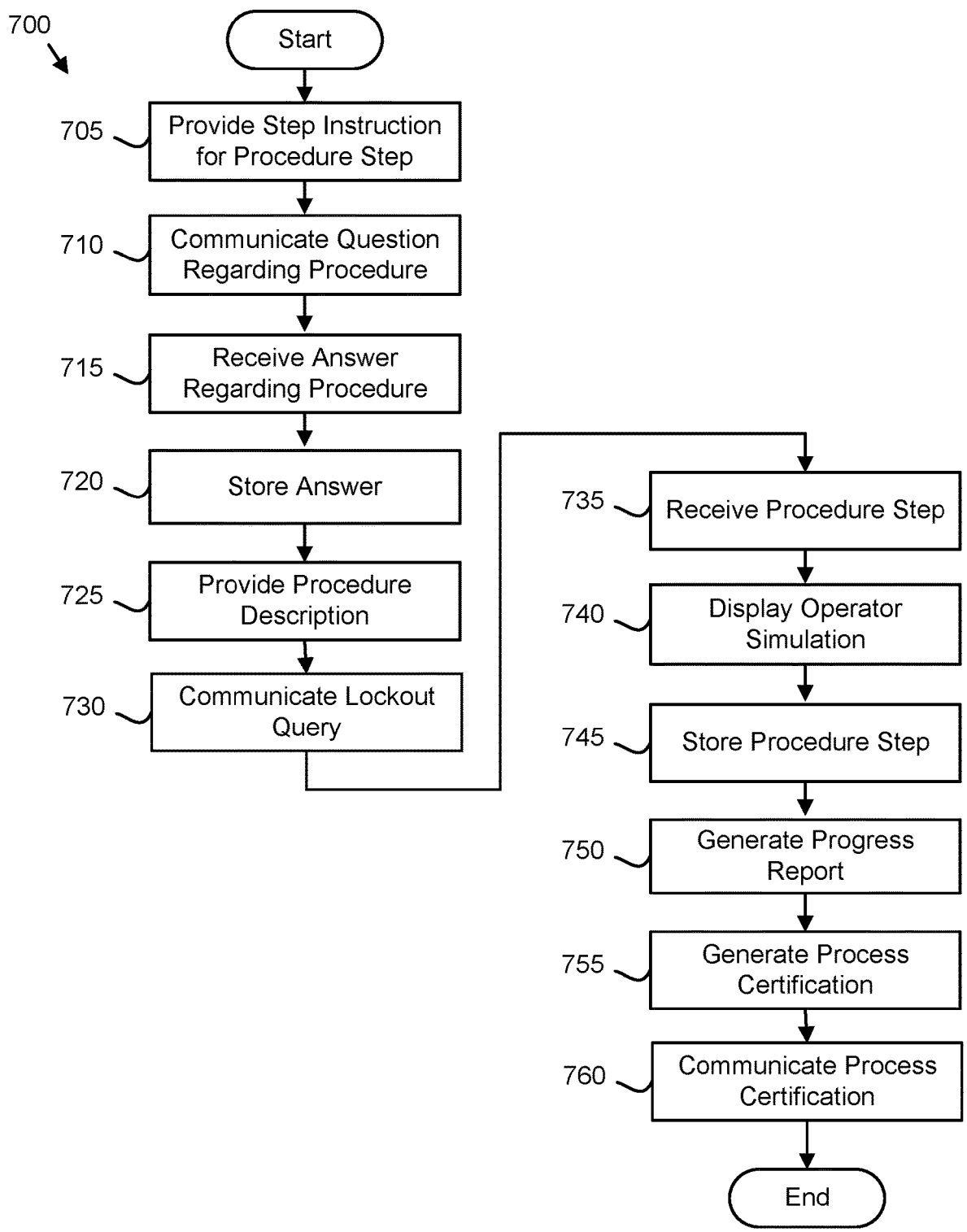
FIG. 4F is a schematic flow chart diagram illustrating one embodiment of a training method.

FIG. 4F is a schematic flow chart diagram illustrating one embodiment of a training method 700. The method 700 may train the operator to safely use the equipment instance 160. The method 700 may be performed by the processor 305. Alternatively, the method 700 may be performed by a program product. The program product may comprise a computer readable storage medium that stores program code. The program code may be executed by the processor 305 to perform the functions of the method 700.

The method 700 starts, and in one embodiment, the training module 330 provides 705 a step instruction 214 for an equipment procedure 215 that is performed on the equipment instance 160. The mobile device 105 may provide the step simulation 216 of the step instruction 214. The step simulation 216 may reference the procedure simulation 276. In one embodiment, the step simulation 216 shows the operator simulation 278 and the machine simulation 288 interacting to perform the equipment procedure 215. Alternatively, the step simulation 216 shows still and/or video images of performing the equipment procedure 215 on the equipment instance 160.

The method 700 may further communicate 710 a step question 226 regarding the equipment procedure 215 to the operator through the mobile device 105. For example, the method 700 may communicate 710 the step question 226 by displaying a written question, presenting a video question, presenting an audio question, and presenting a computer-generated simulation question. One or more step answers 228 corresponding to the step question 226 may also be communicated to the operator through the mobile device 105.

The training module 330 may further receive 715 a step answer 228 selected by the operator through the mobile device 105. The step answer 228 may be regarding the equipment procedure 215. The step answer 228 may be received 715 in response to the step question 226. In one embodiment, the operator may select an answer title 244. Alternatively, the operator may select a computer-generated simulated action and/or video action. The training module 330 may store 720 the step answer 228. In one embodiment, the step answer 228 is stored 720 on the server 105. Alternatively, the step answer 228 may be stored 720 on the mobile device 105.

In one embodiment, the training module 330 provides 725 the procedure description 207 for an equipment procedure 215 to the operator. The procedure description 207 may be provided 725 through the mobile device 105. For example, the training module 330 may provide 725 a written work order procedure description 207 to the operator. Alternatively, the training module 330 may provide 725 an audio and/or video instruction with the procedure description 207.

The method 700 may communicate 730 a lockout query through the mobile device 105 to the operator. The lockout query may include one or more lockout decisions 224 that correspond to the procedure steps 204 of the equipment procedure 215 corresponding to the procedure description 207. For example, communicating 730 the lockout query may present to or more lockout decisions 224 to the operator through the mobile device 105 after providing 725 the procedure description 207. Each lockout decision 224 may be communicated 730 as one or more of a decision title 256, a decision image 252, a decision description 254, and a step simulation 216.

The operator may select a lockout decision 224. The lockout decision 224 may be selected by the operator using the mobile device 105. In one embodiment, the lockout decision 224 is received 735 by the operator activating simulated controls of the step simulation 216 on the mobile device 105. Alternatively, the lockout decision 224 may be received by the operator activating controls of the equipment instance 160. In addition, the operator may select the decision title 256, the decision image 252, and/or the decision description 254.

The training module 330 may further receive 735 the procedure step 204 corresponding to the selected lockout decision 224. The procedure step 204 may be directed to the machine simulation 288. The procedure step 204 may be received 735 in response to the lockout query. The lockout decision 224 may indicate whether the procedure step 204 requires a lockout of the equipment instance 160.

In one embodiment, the training module 330 displays 740 the operator simulation 278 interacting with the machine simulation 288. The operator simulation 278 may be personalized with an image of the operator used to generate the texture map 266 for one or more body parts 264. The motion matrix 268 of one or more body parts 264 may be manipulated to show the operator simulation 278 interacting with the machine simulation 288. The display 740 of the operator simulation 278 interacting with the machine simulation 288 may be an embodiment of a step consequence 218.

The motion matrix 268 of one or more articulated elements 272 may be manipulated to show the step consequence 218 of the procedure step 204. Alternatively, the step consequence 218 may be illustrated as electrical arcing, a gas leak, a fire, and the like. The operator simulation 278 may be manipulated in response to motion and/or action of the machine simulation 288.

The training module 330 may store 745 the procedure step 204 and/or lockout decision 224 selected by the operator. In a certain embodiment, the procedure step 204 is stored 745 on the server 105. Alternatively, the procedure step 204 may be stored 745 on the mobile device 105.

The training module 330 may generate 750 the progress report 208 based on the lockout decision 224 and the step answer 228 for one or more procedure steps 204. The progress report 275 may include the process score, the decision scores 248, the answer scores 251, or combinations thereof.

The training module 330 may further generate 755 the process certification 212. The process certification 212 may include the process score, the decision scores 248, the answer scores 251, and/or an indication whether or not the operator's performance was satisfactory from the auditor.

The training module 330 may communicate 760 the process certification 212 to an employer, an administrator, a regulatory agency, or the like. In addition, the training module 330 may communicate 760 the process certification 212 to the operator and the method 700 ends.

INDUSTRIAL APPLICABILITY

Operators are more likely to safely operate equipment 160 when the operators have access to the appropriate equipment procedures 215 and equipment permits 270. In addition, operators are more likely to safely operate equipment 160 when the operators have been properly trained. The embodiments provide the operator with equipment procedures 215 and equipment permits 270 through the mobile device 105 at the job site where the equipment 160 is located, assuring the operator has the correct equipment procedure 215 and correct equipment permit 270.

In addition, the embodiments provide the operator with tutorials 295 to train the operator to correctly use and maintain the equipment 160. The embodiments further provide the operator with simulations 285 that show the operator the consequences of various interactions with the equipment 160.

Using the simulations 285, the embodiments train the operator by displaying the operator simulation 278 interacting with the machine simulation 288 for procedure steps 204 performed with the equipment 160. The operator is given memorable and graphic feedback as to the consequences of the procedure steps 204.

By receiving a procedure step 204 and showing the consequences as embodied in displaying the operator simulation 278 interacting with the machine simulation 288 while performing the procedure step 204 in accordance with the lockout decision 224, the embodiments increase the effectiveness of training for performing equipment procedures 215 on the equipment instance 160. As a result, the operator is more likely to remember the training on the use of the equipment 160. Thus the safe use of the equipment 160 is increased.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:
1. A method comprising:
  synchronizing, by use of a processor, equipment statuses to a mobile device through a network from a procedure database, wherein each equipment status corresponds to an equipment instance of a plurality of equipment instances of specific equipment and each equipment instance corresponds to an equipment reference code;

receiving a first equipment reference code for a first equipment instance at the mobile device;

retrieving a first equipment status of a plurality of equipment statuses that is indexed to the first equipment reference code to the mobile device;

displaying the first equipment status on the mobile device;

retrieving an equipment procedure indexed to the first equipment reference code;

presenting a training in a use of the equipment procedure;

receiving an indication that a portion of the equipment procedure for the first equipment instance is complete, wherein the equipment procedure comprises text that directs a performance to an operation on the first equipment instance;

generating an update of the equipment status from the indication; and synchronizing the updated equipment status to the procedure database.

2. The method of claim 1, the method further comprising retrieving a first equipment tutorial of a plurality of equipment tutorials that is indexed to the first equipment reference code, wherein the first equipment tutorial comprises one or more of text instructions, hypertext instructions, audio instructions, video instructions, and image instructions for performing one or more operations using the first equipment instance.

3. The method of claim 1, the method further comprising recording an audit status comprising a review of the first equipment tutorial.

4. The method of claim 1, the method further comprising receiving an attestation to an audit report from an auditor.

5. The method of claim 1, the method further comprising:
communicating a procedure question; and
receiving a procedure answer in response to the procedure question.

6. The method of claim 5, the method further comprising generating a progress report based on at least one of a procedure step and the procedure answer.

7. The method of claim 5, the method further comprising generating a process certification in response to at least one of a procedure step and the procedure answer exceeding a certification threshold.

8. An apparatus comprising:
a processor;
a memory storing code executable by the processor to perform:
synchronizing, by use of a processor, equipment statuses to a mobile device through a network from a procedure database, wherein each equipment status corresponds to an equipment instance of a plurality of equipment instances of specific equipment and each equipment instance corresponds to an equipment reference code;
receiving a first equipment reference code for a first equipment instance at the mobile device;
retrieving a first equipment status of a plurality of equipment statuses that is indexed to the first equipment reference code to the mobile device;
displaying the first equipment status on the mobile device;
retrieving an equipment procedure indexed to the first equipment reference code;
presenting a training in a use of the equipment procedure;
receiving an indication that a portion of the equipment procedure for the first equipment instance is complete, wherein the equipment procedure comprises text that directs a performance to an operation on the first equipment instance;
generating an update of the equipment status from the indication; and
synchronizing the updated equipment status to the procedure database.

9. The apparatus of claim 8, the processor further retrieving a first equipment tutorial of a plurality of equipment tutorials that is indexed to the first equipment reference code, wherein the first equipment tutorial comprises one or more of text instructions, hypertext instructions, audio instructions, video instructions, and image instructions for performing one or more operations using the first equipment instance.

10. The apparatus of claim 8, the processor further recording an audit status comprising a review of the first equipment tutorial.

11. The apparatus of claim 8, the processor further receiving an attestation to an audit report from an auditor.

12. The apparatus of claim 8, the processor further performing:
communicating a procedure question; and
receiving a procedure answer in response to the procedure question.

13. The apparatus of claim 12, the processor further generating a progress report based on at least one of a procedure step and the procedure answer.

14. The apparatus of claim 12, the processor further generating a process certification in response to at least one of a procedure step and the procedure answer exceeding a certification threshold.

15. A computer program product comprising a non-transitory computer readable storage medium that stores code executable by a processor to perform:
synchronizing, by use of a processor, equipment statuses to a mobile device through a network from a procedure database, wherein each equipment status corresponds to an equipment instance of a plurality of equipment instances of specific equipment and each equipment instance corresponds to an equipment reference code;
receiving a first equipment reference code for a first equipment instance at the mobile device;
retrieving a first equipment status of a plurality of equipment statuses that is indexed to the first equipment reference code to the mobile device;
displaying the first equipment status on the mobile device;
retrieving an equipment procedure indexed to the first equipment reference code;
presenting a training in a use of the equipment procedure;
receiving an indication that a portion of the equipment procedure for the first equipment instance is complete, wherein the equipment procedure comprises text that directs a performance to an operation on the first equipment instance;
generating an update of the equipment status from the indication; and
synchronizing the updated equipment status to the procedure database.

16. The computer program product of claim 15, the processor further retrieving a first equipment tutorial of a plurality of equipment tutorials that is indexed to the first equipment reference code, wherein the first equipment tutorial comprises one or more of text instructions, hypertext instructions, audio instructions, video instructions, and image instructions for performing one or more operations using the first equipment instance.

17. The computer program product of claim 15, the processor further recording an audit status comprising a review of the first equipment tutorial.

18. The computer program product of claim 15, the processor further receiving an attestation to an audit report from an auditor.

19. The computer program product of claim 15, the processor further performing:
   communicating a procedure question; and
      receiving a procedure answer in response to the procedure question.

20. The computer program product of claim 19, the processor further generating a progress report based on at least one of a procedure step and the procedure answer.

* * * * *